United States Patent
Kim et al.

(10) Patent No.: US 10,096,603 B2
(45) Date of Patent: Oct. 9, 2018

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Heejung Kim, Gimpo-si (KR); Seok-Won Cho, Suwon-si (KR); Joonsoo Park, Seongnam-si (KR); SoonMok Ha, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/230,585

(22) Filed: Aug. 8, 2016

(65) Prior Publication Data

US 2017/0053920 A1    Feb. 23, 2017

(30) Foreign Application Priority Data

Aug. 19, 2015  (KR) .................. 10-2015-0116746

(51) Int. Cl.
  *H01L 27/108*   (2006.01)
  *H01L 27/11582*  (2017.01)
  *H01L 49/02*   (2006.01)

(52) U.S. Cl.
  CPC .. *H01L 27/10894* (2013.01); *H01L 27/11582* (2013.01); *H01L 28/00* (2013.01)

(58) Field of Classification Search
  None
  See application file for complete search history.

(56) References Cited

U.S. PATENT DOCUMENTS

| | | | |
|---|---|---|---|
| 7,429,533 B2 | 9/2008 | Huang et al. | |
| 8,158,332 B2 | 4/2012 | Matsunaga et al. | |
| 8,293,656 B2 | 10/2012 | Kim et al. | |
| 8,357,555 B2 | 1/2013 | Tsuji | |
| 8,361,905 B2 | 1/2013 | Kim et al. | |
| 8,466,066 B2 | 6/2013 | Kim | |
| 8,541,316 B2 * | 9/2013 | Sukekawa | H01L 21/0337 438/421 |
| 8,686,563 B2 | 4/2014 | Park et al. | |
| 8,772,167 B2 | 7/2014 | Seo et al. | |

(Continued)

FOREIGN PATENT DOCUMENTS

| | | |
|---|---|---|
| JP | 2009-246226 A | 10/2009 |
| KR | 10-2009-0010399 A | 1/2009 |
| KR | 10-2013-0041630 A | 4/2013 |

*Primary Examiner* — Reema Patel
*Assistant Examiner* — Steven Christopher
(74) *Attorney, Agent, or Firm* — Lee & Morse, P.C.

(57) ABSTRACT

A method of fabricating a semiconductor device includes forming first cell patterns on a substrate, forming a first layer relative to the first cell patterns, and forming a second cell pattern and a peripheral pattern on the first layer. The second cell pattern includes first holes in a cell region and the peripheral pattern is located in a peripheral region. The method also includes filling the first holes, removing the second cell pattern to expose pillars, and forming second holes. Each of the second holes corresponds to adjacent cell spacers of the pillars. The method also includes removing the pillars to form third holes corresponding to respective ones of the cell spacers, and etching the substrate using the cell spacers, the first cell patterns, and the peripheral pattern as etch masks to form a trench.

15 Claims, 40 Drawing Sheets

(56) References Cited

U.S. PATENT DOCUMENTS

2011/0104901 A1  5/2011  Yatsuda et al.
2013/0095663 A1* 4/2013  Seo .................... H01L 21/0337
                                            438/696

* cited by examiner

METHOD OF FABRICATING SEMICONDUCTOR DEVICE

CROSS-REFERENCE TO RELATED APPLICATION

Korean Patent Application No. 10-2015-0116746, filed on Aug. 19, 2015, entitled, "Method of Fabricating Semiconductor Device," is incorporated by reference herein in its entirety.

BACKGROUND

1. Field

One or more embodiments described herein relate to a method for fabricating a semiconductor device.

2. Description of the Related Art

Semiconductor devices are widely used because of their small sizes, multi-functional characteristics, and/or low fabrication costs. Efforts are continually being made to increase the integration of semiconductor devices in order to meet consumer needs and demands of the electronic industry. However, increases in integration have presented challenges. For example, efforts to reduce the widths and/or spaces of patterns in semiconductor devices have produced an increase in the heights and/or aspect ratios of the patterns. As a result, distributions of deposition and/or etching processes performed on thin layers may deteriorate, which, in turn, may adversely affect reliability.

SUMMARY

In accordance with one or more embodiments, a method of fabricating a semiconductor device includes preparing a substrate including a cell region and a peripheral region; forming first cell patterns in one direction and substantially parallel to each other on the substrate of the cell region; forming a first material layer filling a space between the first cell patterns on the substrate of the cell and peripheral regions; forming a second cell pattern including first holes on the first material layer of the cell region and a peripheral pattern on the first material layer of the peripheral region; forming a plurality of pillars respectively filling the first holes of the second cell pattern; forming a blocking layer on the peripheral pattern and selectively covering the peripheral region; removing the second cell pattern to expose the pillars; forming cell spacers on outer sidewalls of the pillars to define second holes, each of the second holes corresponding to four cell spacers adjacent to each other; removing the pillars to form third holes corresponding to the cell spacers, respectively; and etching the substrate using the cell spacers, the first cell patterns, and the peripheral pattern as etch masks to form a trench.

The first cell patterns may include a material having an etch selectivity with respect to the first material layer and the cell spacers. The first cell patterns may include poly-silicon, the first material layer may include a spin-on-hardmask (SOH) material, and the cell spacers include silicon oxide.

Forming the second cell pattern, the peripheral pattern, the pillars, and the blocking layer may include forming a second material layer on the first material layer; forming a cell mask pattern on the second material layer of the cell region and a peripheral mask pattern on the second material layer of the peripheral region, the cell mask pattern having holes corresponding to the first holes; etching the second material layer using the cell mask pattern and the peripheral mask pattern as etch masks to form the second cell pattern and the peripheral pattern; forming a third material layer filling the first holes of the second cell pattern on the second cell pattern and the peripheral pattern; forming the blocking layer on the third material layer of the peripheral region; and performing an etch-back process on the third material layer of the cell region exposed by the blocking layer until a top surface of the second cell pattern is exposed to form the pillars.

The blocking layer may be etched during the etch-back process performed on the third material layer of the cell region. The third material layer may include a material having an etch selectivity with respect to the second material layer. The second material layer may include silicon oxide, and the third material layer may include a spin-on-hardmask (SOH) material. The blocking layer may include a photoresist material.

The method may include conformally forming a spacer layer on the first material layer on which the cell spacers are formed, wherein the spacer layer partially fills the second and third holes. The method may include anisotropically etching the spacer layer to form additional cell spacers on inner sidewalls and outer sidewalls of the cell spacers, wherein etching the substrate includes etching the substrate of the cell region using the additional cell spacers, the cell spacers, and the first cell patterns as etch masks to form the trench.

The method may include forming a device isolation layer defining active regions by filling the trench with an insulating material, wherein each of the active regions has a substantially elliptical shape having a long axis parallel to the extending direction of the first cell pattern. Each of the second holes may be formed on one of the first cell patterns, the second holes may be spaced apart from each other and arranged along a first direction and a second direction crossing the first direction, each of the first cell patterns may extend in a direction perpendicular to the first and second directions, two first cell patterns maybe formed between two second holes adjacent to each other in the first direction, and two second holes adjacent to each other in the second direction may be respectively formed on two first cell patterns adjacent to each other.

Each of the third holes may be formed on one of the first cell patterns, the third holes may be spaced apart from each other and arranged along a first direction and a second direction perpendicular to the first direction, each of the first cell patterns may extend in a direction not perpendicular to the first and second directions, two first cell patterns may be between two third holes adjacent to each other in the first direction, and two third holes adjacent to each other in the second direction may be respectively formed on two first cell patterns adjacent to each other.

The second holes and the third holes may be alternately arranged on each of the first cell patterns along a longitudinal direction of each of the first cell patterns, adjacent four of the third holes surround one of the second holes, the one of the second holes may be at a center of a first imaginary quadrangle and the adjacent four of the third holes are at vertexes of the first imaginary quadrangle, respectively, adjacent four of the second holes may surround one of the third holes, and the one of the third holes may be at a center of a second imaginary quadrangle and the adjacent four of the second holes are at vertexes of the second imaginary quadrangle, respectively. Each of the second holes may have a diamond shape, and each of the third holes may have a circular shape or an elliptical shape.

In accordance with one or more other embodiments, a method of fabricating a semiconductor device includes forming first cell patterns on a substrate; forming a first layer relative to the first cell patterns; forming a second cell pattern and a peripheral pattern on the first layer, the second cell pattern including first holes in a cell region of the substrate and the peripheral pattern located in a peripheral region of the substrate; filling the first holes of the second cell pattern; removing the second cell pattern to expose pillars; forming second holes, each corresponding to a plurality of adjacent cell spacers of the pillars; removing the pillars to form third holes corresponding to respective ones of the cell spacers; and etching the substrate using the cell spacers, the first cell patterns, and the peripheral pattern as etch masks to form a trench. The first cell patterns may include poly-silicon, the first layer may include a spin-on-hardmask (SOH) material, and the cell spacers may include silicon oxide.

BRIEF DESCRIPTION OF THE DRAWINGS

Features will become apparent to those of skill in the art by describing in detail exemplary embodiments with reference to the attached drawings in which:

FIGS. 1A to 17A illustrate various stages in one embodiment of a method for fabricating a semiconductor device, and FIGS. 1B to 17B illustrate cross-sectional views taken along lines I-I' and II-II' in FIGS. 1A to 17A, respectively;

FIG. 11C to 17C illustrate cross-sectional views taken along lines III-III' in FIGS. 11A to 17A, respectively.

DETAILED DESCRIPTION

Figure 1A:
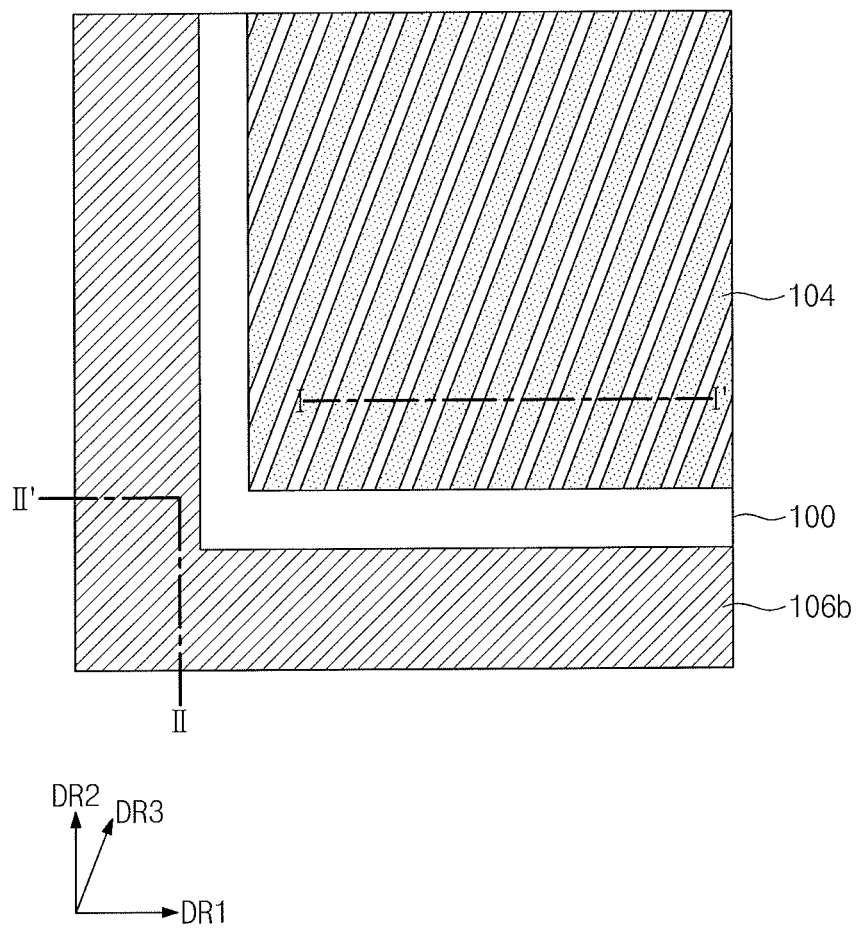

Example embodiments will now be described more fully with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. In the accompanying drawings, the thicknesses of layers and regions are exaggerated for clarity.

Moreover, exemplary embodiments are described herein with reference to cross-sectional views and/or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features.

Thus, the regions illustrated in the figures are schematic in nature and their shapes are not intended to illustrate the actual shape of a region of a device and are not intended to limit the scope of example embodiments. It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts.

The terminology used herein is for the purpose of describing particular embodiments only and is not intended to limit the invention. As used herein, the singular terms "a," "an," and "the" are intended to include the plural forms as well, unless the context indicates otherwise. As used herein, the term "and/or" includes any and all combinations of one or more associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1A to 17A illustrating various stages in one embodiment of a method for fabricating a semiconductor device, and FIGS. 1B to 17B are cross-sectional views taken along lines I-I' and II-II' in FIGS. 1A to 17A, respectively. FIGS. 11C to 17C are cross-sectional views taken along lines III-III' of FIGS. 11A to 17A, respectively.

Figure 1B:
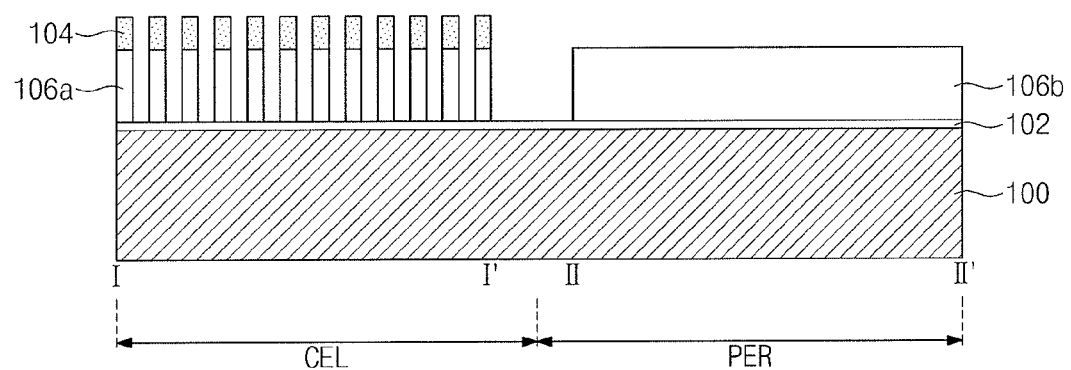

Referring to FIGS. 1A and 1B, a pad oxide layer 102 and a first material layer may be sequentially formed on a substrate 100. The substrate 100 may include, for example, a semiconductor material (e.g., silicon, geranium, or silicon-germanium) or may be a silicon-on-insulator (SOI) substrate or a germanium-on-insulator (GOI) substrate. The substrate 100 may include a cell region CEL and a peripheral region PER. Memory cells are formed in the cell region CEL. Bulky patterns (e.g., logic cells, align keys, and/or photo keys) may be formed in the peripheral region PER. The pad oxide layer 102 may include, for example, silicon oxide. The first material layer may include, for example, poly-silicon. The pad oxide layer 102 and the first material layer may be formed on the substrate 100 of the cell region CEL and the substrate 100 of the peripheral region PER.

Next, first mask patterns 104 may be formed on the first material layer. The first material layer may be etched using the first mask patterns 104 as etch masks to form first cell patterns 106a in the cell region CEL and a first peripheral pattern 106b in the peripheral region PER. In some embodiments, the first cell patterns 106a may extend in one direction (e.g., DR3) and may be arranged at predetermined (e.g., equal) distances to constitute a line-and-space structure. The first mask patterns 104 may include a material having an etch selectivity with respect to the first material layer. For example, the first mask patterns 104 may include at least one of silicon oxide, silicon nitride, silicon oxynitride, or a spin-on-hardmask (SOH) material. In some embodiments, the first mask patterns 104 may include silicon oxide.

The first mask patterns 104 may be removed or remain after formation of the first cell patterns 106a and the first peripheral pattern 106b. In some embodiments, the first mask patterns 104 may not be formed on the first peripheral pattern 106b.

Figure 2A:
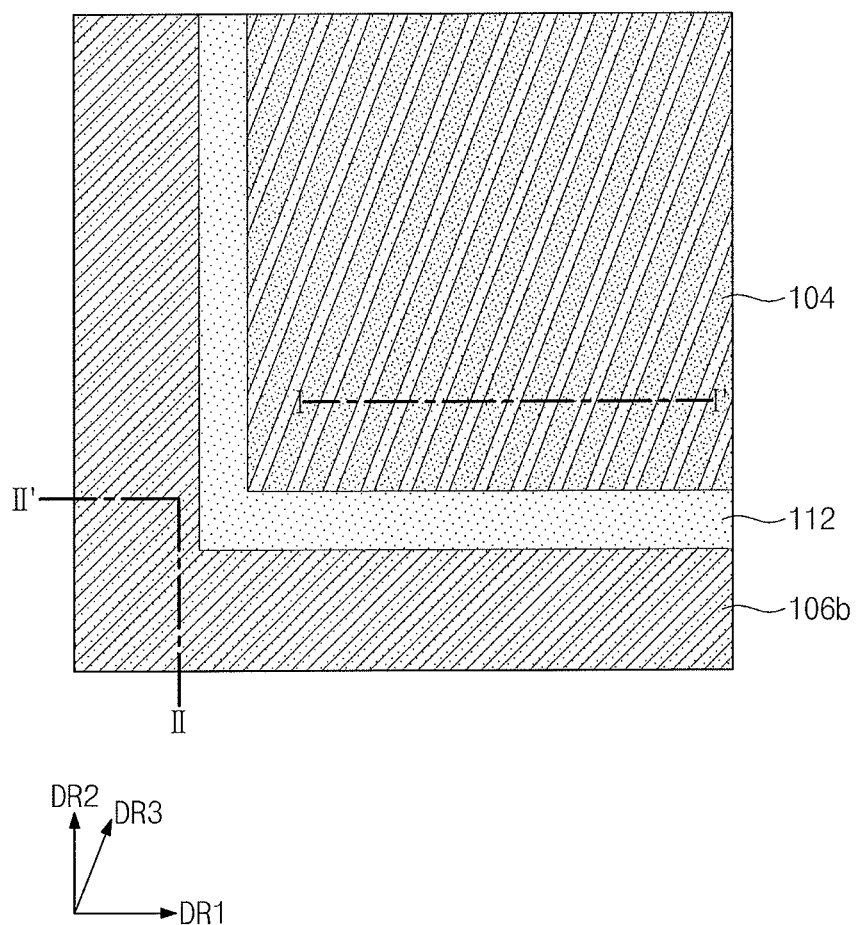
Figure 2B:
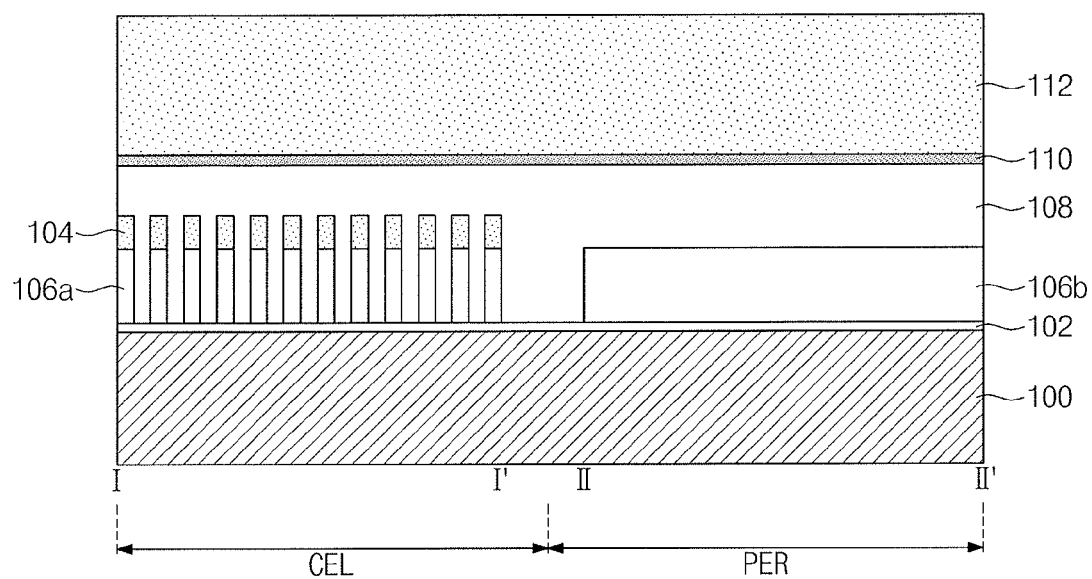

Referring to FIGS. 2A and 2B, a second material layer 108 and a third material layer 112 may be formed on the first cell patterns 106a and the first peripheral pattern 106b. The second material layer 108 may be formed to completely fill spaces between the first cell patterns 106a and a space between the first peripheral pattern 106b and the first cell patterns 106a. The second material layer 108 may include, for example, a SOH material. The third material layer 112 may include a material having an etch selectivity with respect to the first material layer. For example, the third material layer 112 may include silicon oxide.

In some embodiments, a buffer layer 110 including amorphous silicon may be formed between the second and third material layers 108 and 112. The buffer layer 110 may prevent the second material layer 108 from being etched in a subsequent process. In certain embodiments, the buffer layer 110 may be omitted.

Figure 3A:
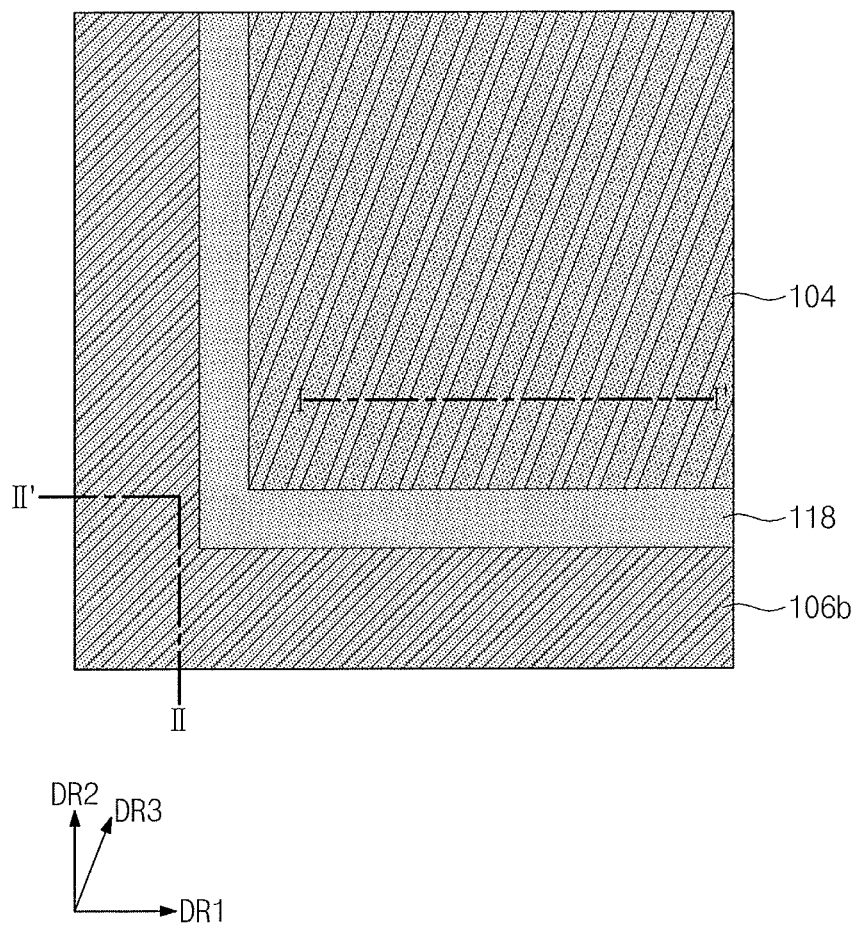
Figure 3B:
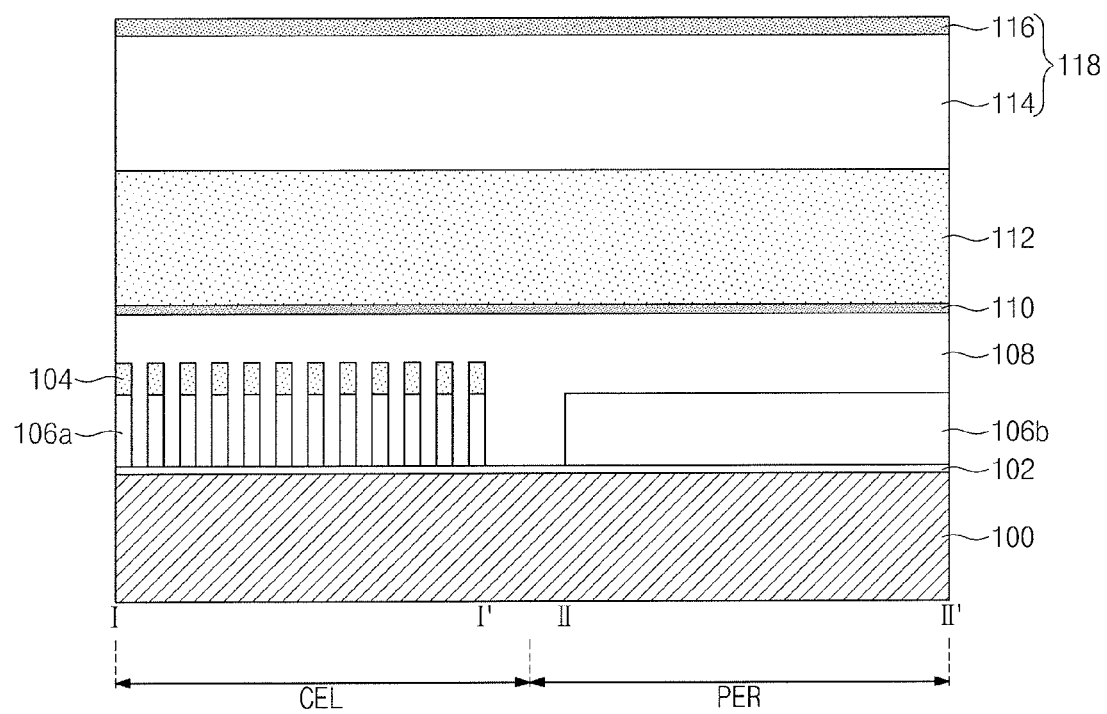

Referring to FIGS. 3A and 3B, a hard mask layer 118 may be formed on the third material layer 112. The hard mask layer 118 may include a material having an etch selectivity with respect to the second material layer 108. In some embodiments, the hard mask layer 118 may have a multi-layered structure. For example, the hard mask layer 118 may include a first layer 114 including a SOH material and a second layer 116 including silicon oxynitride. The first and second layers 114 and 116 may be sequentially stacked on the third material layer 112.

Figure 4A:
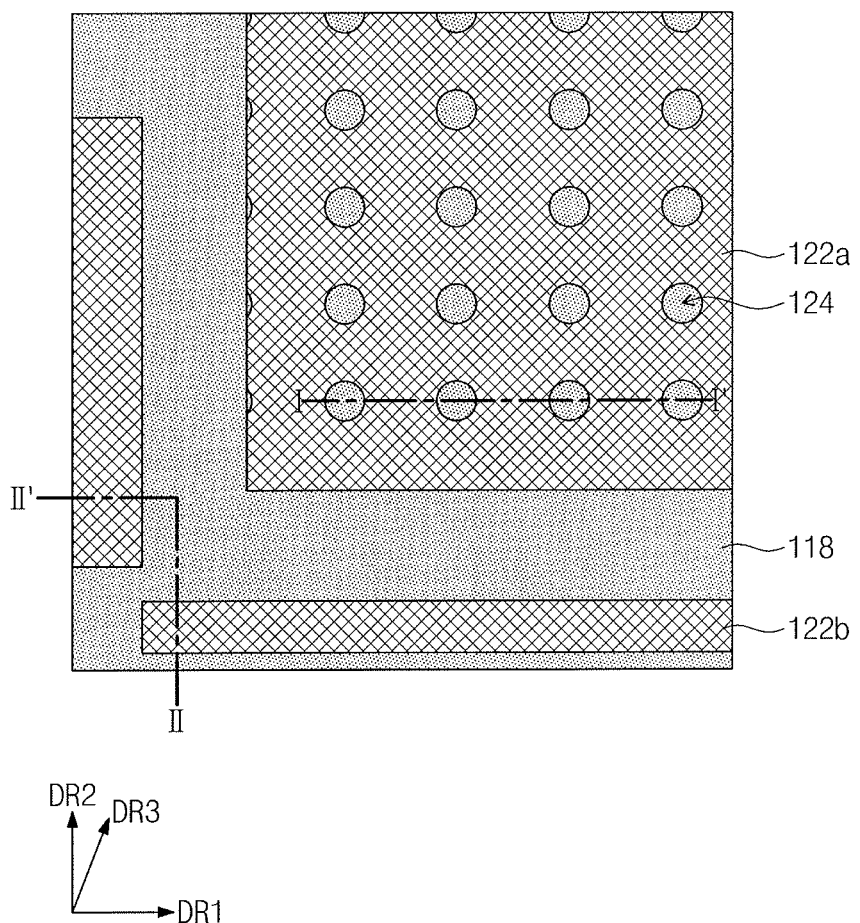
Figure 4B:
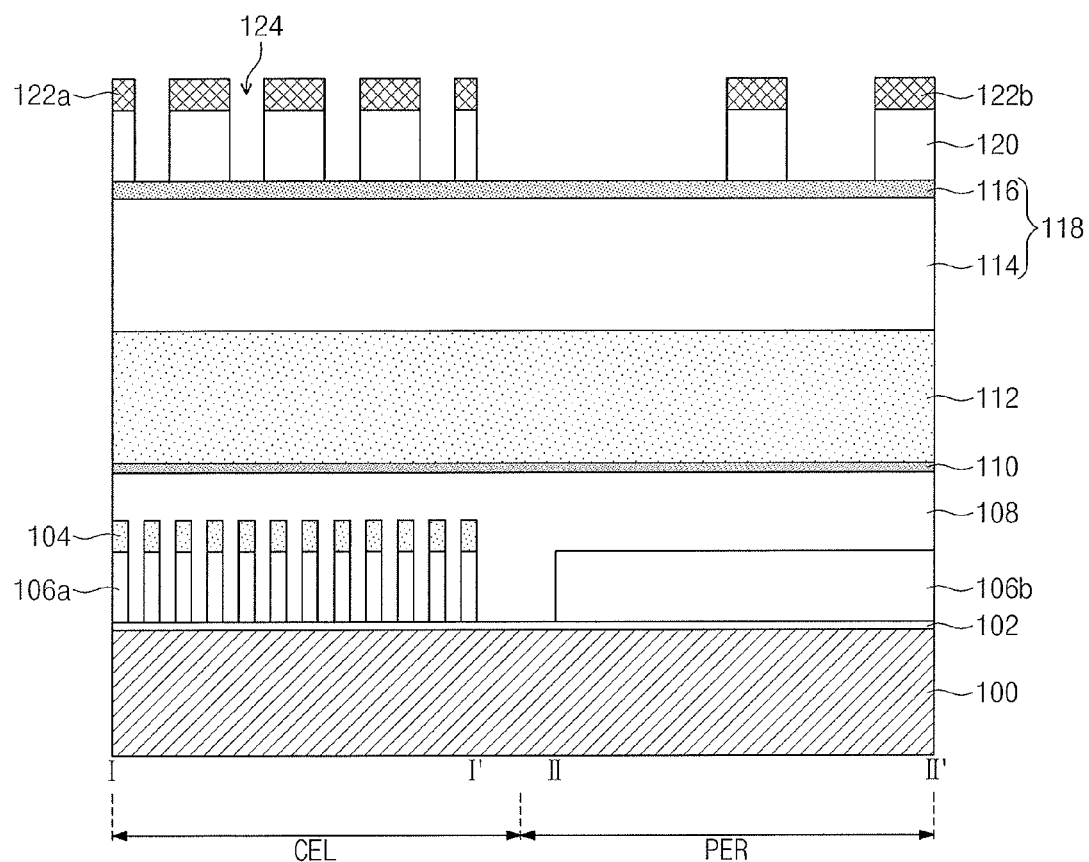

Referring to FIGS. 4A and 4B, a photoresist pattern 122a and 122b may be formed on the hard mask layer 118. The photoresist pattern 122a and 122b may include a first portion 122a covering the cell region CEL and a second portion 122b partially covering the peripheral region PER. The first portion 122a of the photoresist pattern may include a plurality of first holes 124. Each of the first holes 124 may have a predetermined shape, e.g., a circular planar shape. Diameters of the first holes 124 may be substantially equal to each other. The arrangement of the first holes 124 and the relationship between the first holes 124 and the first cell patterns 106a will be described later in more detail.

The second portion 122b of the photoresist pattern may have a predetermined (e.g., bar) shape extending in one direction and may have the minimum width greater than the diameter of the first hole 124 or a distance between the first holes 124 adjacent to each other. As described above, the bulky patterns may be formed in the peripheral region PER. In another embodiment, the patterns of the peripheral region PER may have a different shape. The shape of the second portion 122b may be changed depending, for example, on the structure of the completed semiconductor device. The second portion 122b of the photoresist pattern may have a different shape as that illustrated in FIG. 4A.

In some embodiments, an anti-reflective coating layer 120 may be formed between the hard mask layer 118 and the photoresist pattern 122a and 122b. The arrangement of the first holes 124 and relationship between the first holes 124 and the first cell patterns 106a will be described hereinafter.

Figure 4C:
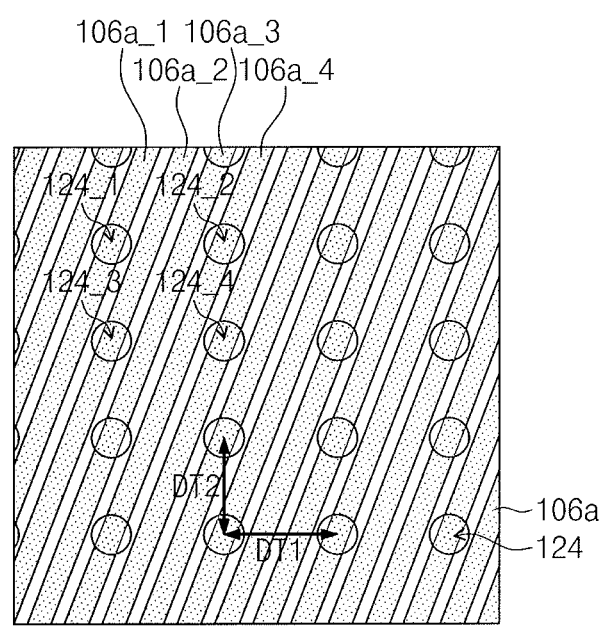
FIG. 4C illustrates an example of a relationship between first patterns and first holes in FIG. 4A.
Figure 4C:
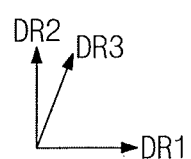

FIG. 4C illustrates an example of a relationship between the first cell patterns 106a and the first holes 124 of FIG. 4A. Referring to FIG. 4C, the first holes 124 may be spaced apart from each other and arranged along a first direction DR1 (e.g., a row direction) and a second direction DR2 (e.g., a column direction). The first and second directions DR1 and DR2 may cross or be perpendicular to each other. First holes 124_1 and 124_2 of a first row (or a first column) may be at positions corresponding to first holes 124_3 and 124_4 of a second row (or a second column), respectively. For example, the first holes 124_1 and 124_2 of the first row may be aligned with the first holes 124_3 and 124_4 of the second row in the second direction DR2, respectively.

The first holes 124 arranged in the first direction DR1 may be spaced apart from each other by a first distance DT1. The first holes 124 arranged in the second direction DR2 may be spaced apart from each other by a second distance DT2. The first distance DT1 may be different from the second distance DT2. In some embodiments, the first distance DT1 may be greater than the second distance DT2.

Each of the first cell patterns 106a may extend in a third direction DR3 that is not perpendicular to the first and second directions DR1 and DR2. Each of the first holes 124 may be formed on one of the first cell patterns 106a. A plurality of the first holes 124 may be spaced apart from each other on one of the first cell patterns 106a.

Two first cell patterns 106a_2 and 106a_3 may be between two first holes 124_1 and 124_2 adjacent to each other in the first direction DR1 when viewed from a plan view. For example, one 124_1 of the two first holes 124_1 and 124_2 may be formed on a first one 106a_1 of four first cell patterns 106a_1, 106a_2, 106a_3, and 106a_4 adjacent to each other. The other 124_2 of the two first holes 124_1 and 124_2 may be formed on a fourth one 106a_4 of the four first cell patterns 106a_1, 106a_2, 106a_3, and 106a_4. Second and third ones 106a_2 and 106a_3 of the four first cell patterns 106a_1, 106a_2, 106a3, and 106a4 may be between the two first holes 124_1 and 124_2 when viewed from a plan view.

Two first holes 124_1 and 124_3 adjacent to each other in the second direction DR2 may be formed on two first cell patterns 106a_1 and 106a_2 adjacent to each other, respectively. For example, one 124_1 of the two first holes 124_1 and 124_3 adjacent to each other in the second direction DR2 may be formed on a first one 106a_1 of the two first cell patterns 106a_1 and 106a_2. The other 124_3 of the two first holes 124_1 and 124_3 may be formed on a second one 106a_2 of the two first cell patterns 106a_1 and 106a_2.

Figure 5A:
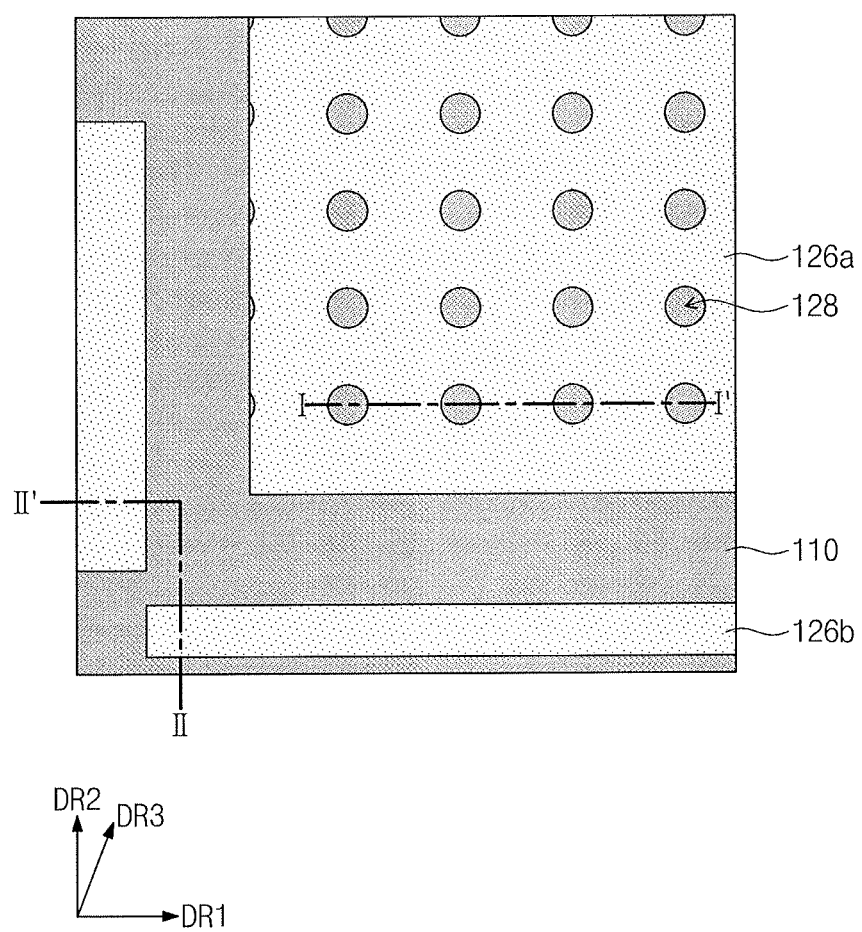
Figure 5B:
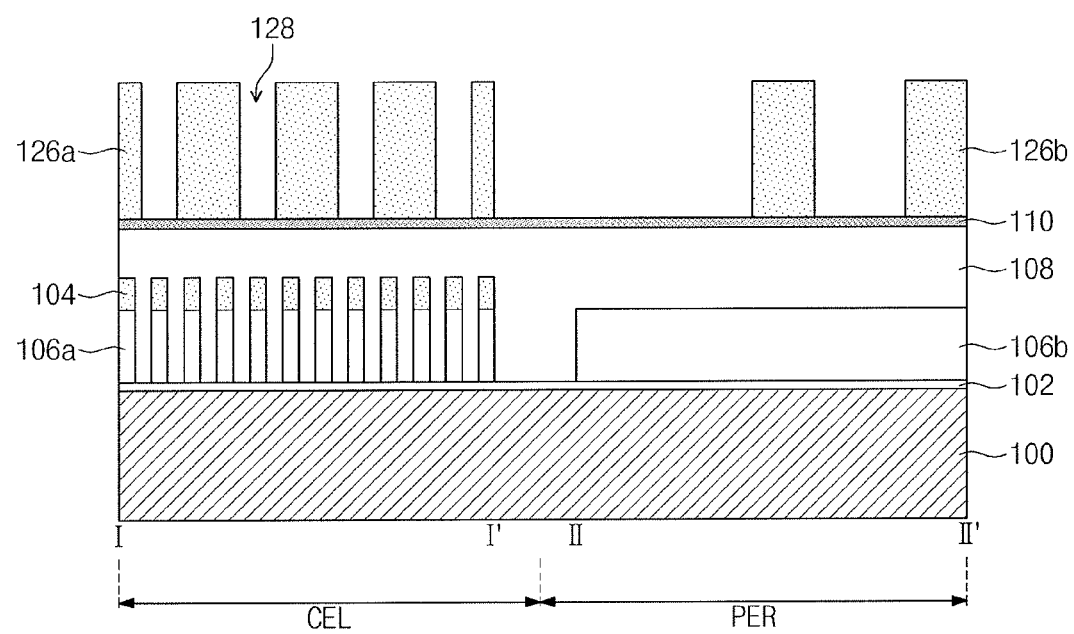

Referring to FIGS. 5A and 5B, the hard mask layer 118 may be etched using the photoresist pattern 122a and 122b as an etch mask to form a second mask pattern. The third material layer 112 may be etched using the photoresist pattern 122a and 122b and the second mask pattern as an etch mask to form third patterns 126a and 126b.

The third patterns 126a and 126b may include a third cell pattern 126a formed in the cell region CEL and a third peripheral pattern 126b formed in the peripheral region PER. The third cell pattern 126a may include second holes 128 respectively corresponding to the first holes 124. The third peripheral pattern 126b may have a shape (e.g., a bar shape) corresponding to that of the second portion 122b of the photoresist pattern. The third cell pattern 126a may be spaced apart from the third peripheral pattern 126b. The photoresist pattern 122a and 122b and the second mask pattern may be removed after the formation of the third patterns 126a and 126b.

Figure 6A:
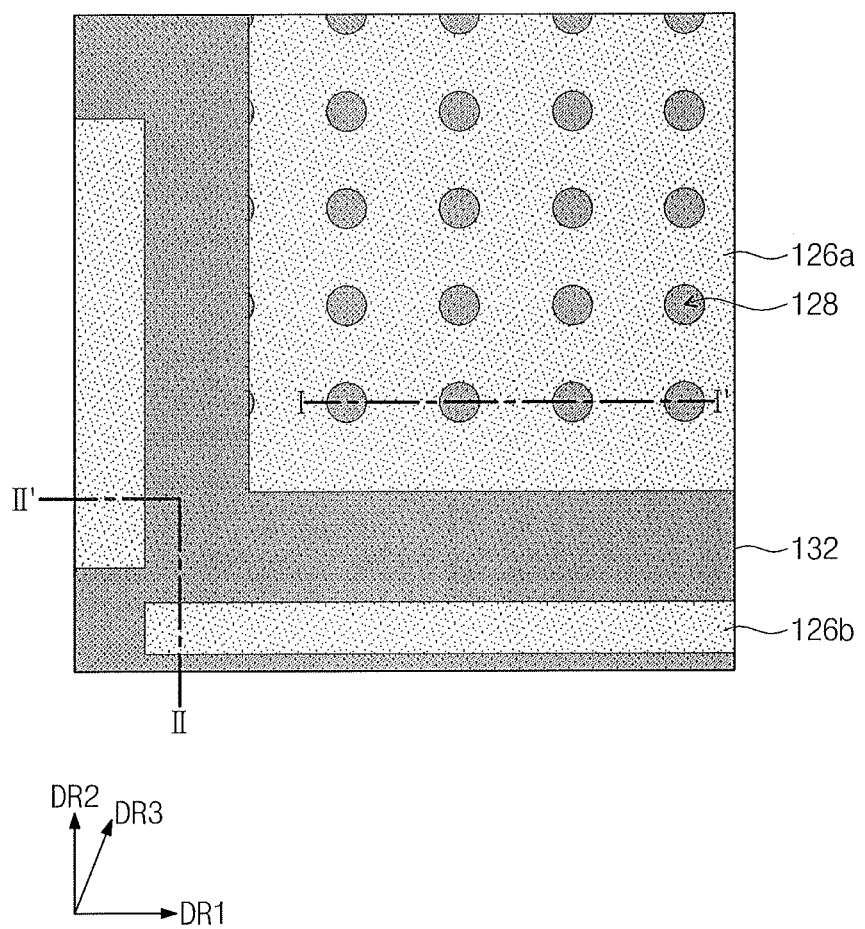
Figure 6B:
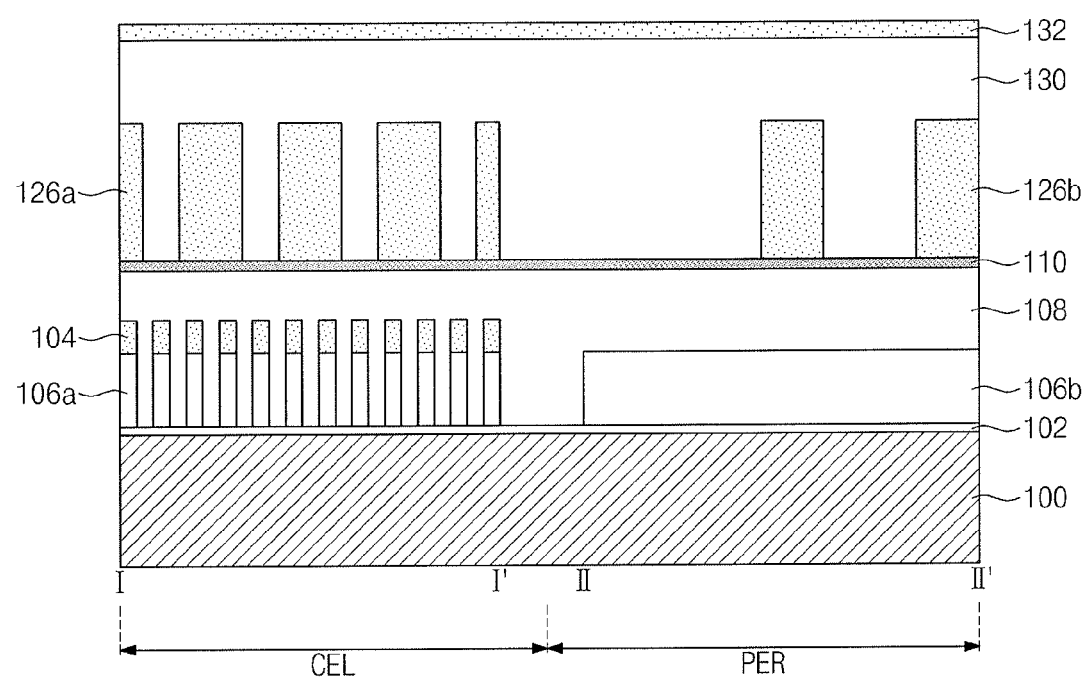

Referring to FIGS. 6A and 6B, a fourth material layer 130 may be formed on the third patterns 126a and 126b. The fourth material layer 130 may fill the second holes 128 and a space between the third cell pattern 126a and the third peripheral pattern 126b. The fourth material layer 130 may include a material having an etch selectivity with respect to the third patterns 126a and 126b. In addition, the fourth material layer 130 may include a material having excellent gap-fill and coverage characteristics capable of filling the second holes 128 and the space between the third cell pattern 126a and the third peripheral pattern 126b. For example, the fourth material layer 130 may include a SOH material.

In some embodiments, an additional layer 132 may be formed on the fourth material layer 130. The additional layer 132 may be provided for a rework process performed in a subsequent photolithography process. The additional layer 132 may include, for example, silicon oxide formed using an atomic layer deposition (ALD) process. In certain embodiments, the additional layer 132 may be omitted.

Figure 7A:
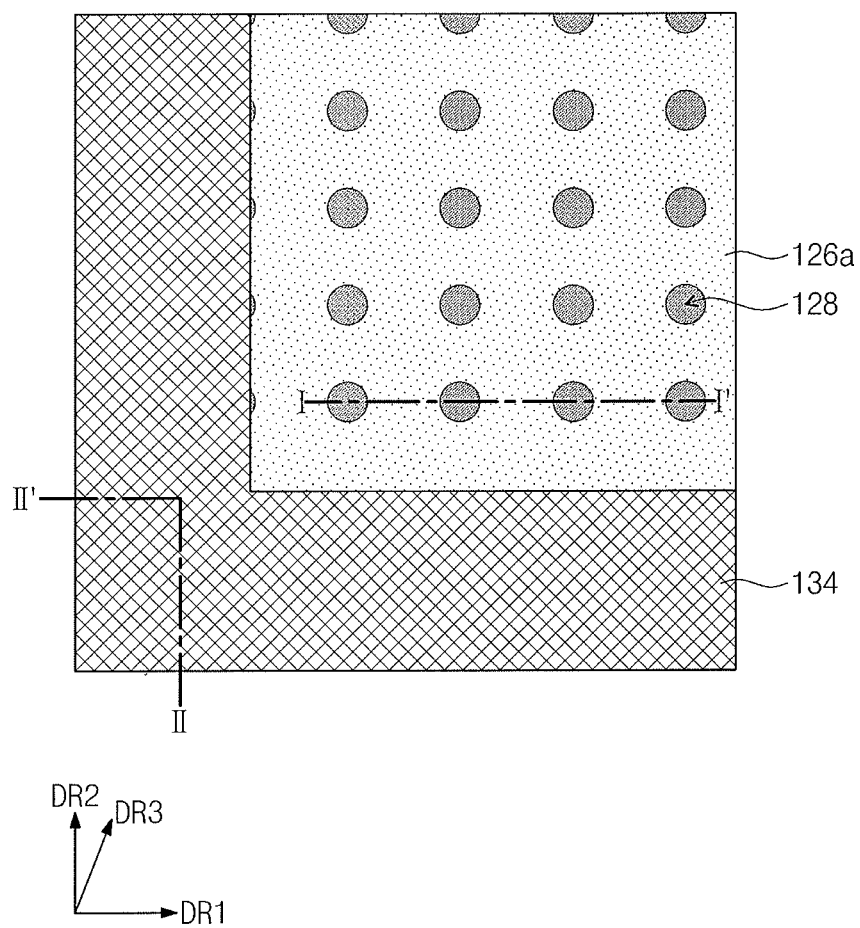
Figure 7B:
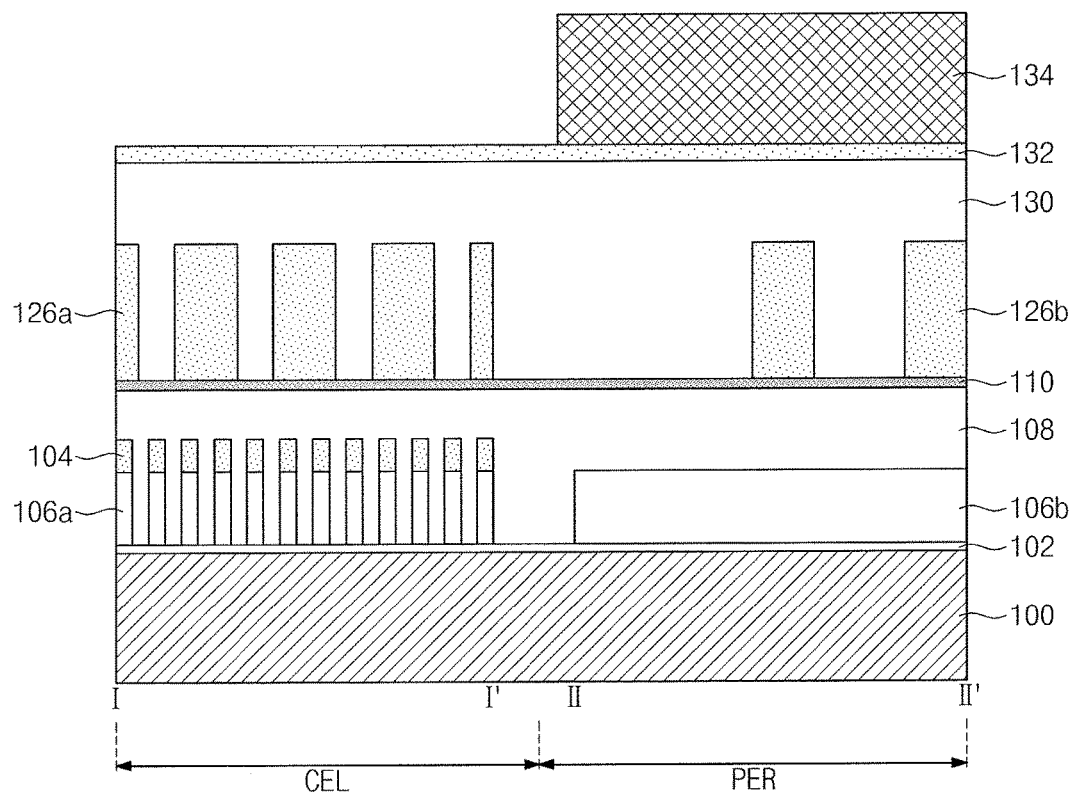

Referring to FIGS. 7A and 7B, a fifth material layer 134 may be formed on the fourth material layer 130. The fifth material layer 134 may selectively cover the fourth material layer 130 of the peripheral region PER. The fifth material layer 134 may include a photoresist. The rework process may be performed by an error or misalignment of photolithography equipment while the photolithography process is performed to form the fifth material layer 134 opening the cell region CEL. Thus, the additional layer 132 may be further formed.

Figure 8A:
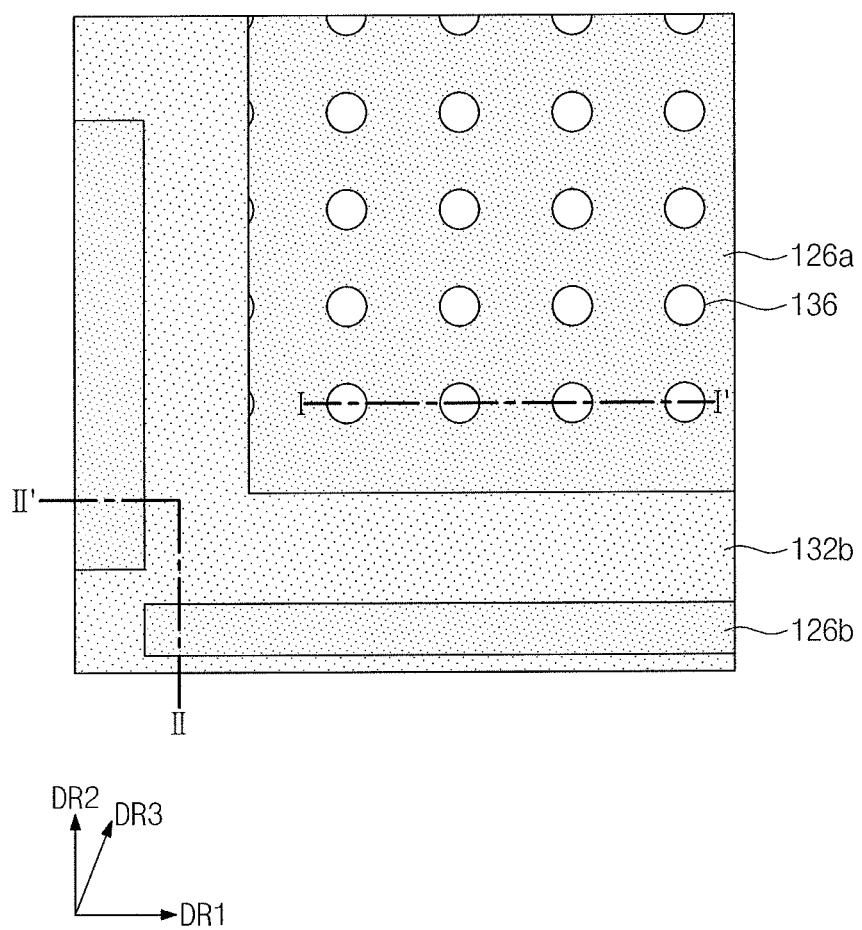
Figure 8B:
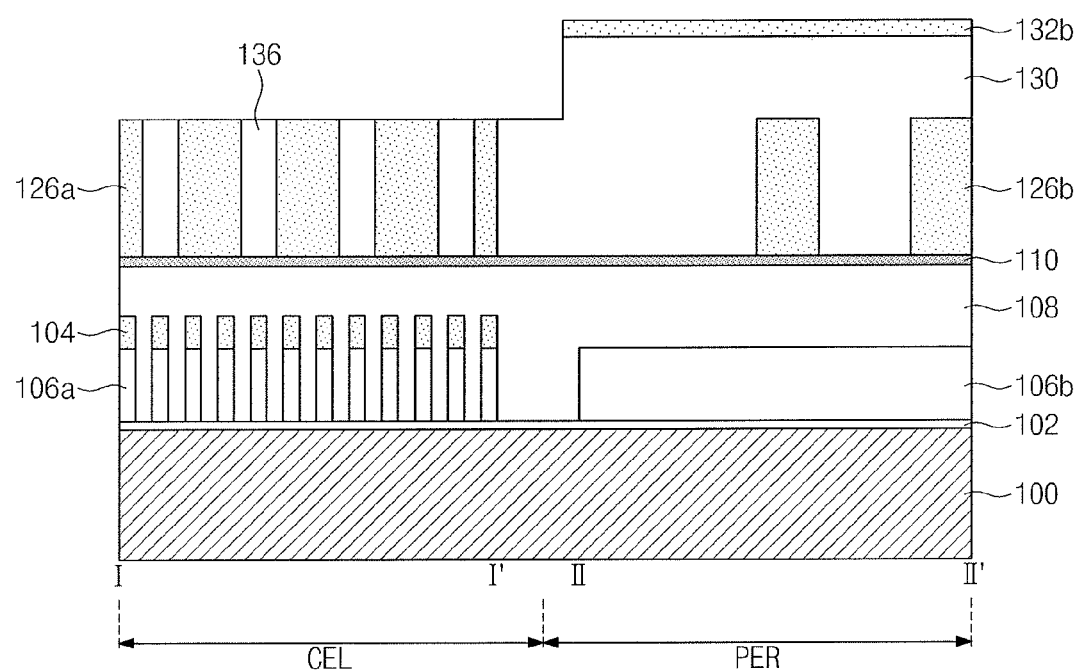

Referring to FIGS. 8A and 8B, the fourth material layer 130 may be etched using the fifth material layer 134 as an etch mask until a top surface of the third cell pattern 126a is exposed. The etching process may use an etch-back process. Pillars 136 may be formed in the second holes 128 by the etch-back process.

For example, during the etch-back process, the additional layer 132 and the fourth material layer 130 of the cell region CEL may be etched and the fifth material layer 134 of the peripheral region PER may be etched. The etch-back process may be performed until the top surface of the third cell pattern 126a is exposed. The fifth material layer 134 of the peripheral region PER may be completely or partially etched. A portion 132b of the additional layer 132, which is disposed in the peripheral region PER, may remain on the fourth material layer 130. The pillars 136 may be used as mandrel patterns in a double patterning technology (DPT) process to be performed.

According to one or more embodiments, the pillars 136 (e.g., the mandrel patterns of the DPT process) may be formed in the cell region CEL after the peripheral region PER is selectively blocked by the fourth material layer 130. Thus, process efficiency may be improved to reduce fabrication costs of the semiconductor device.

Figure 9A:
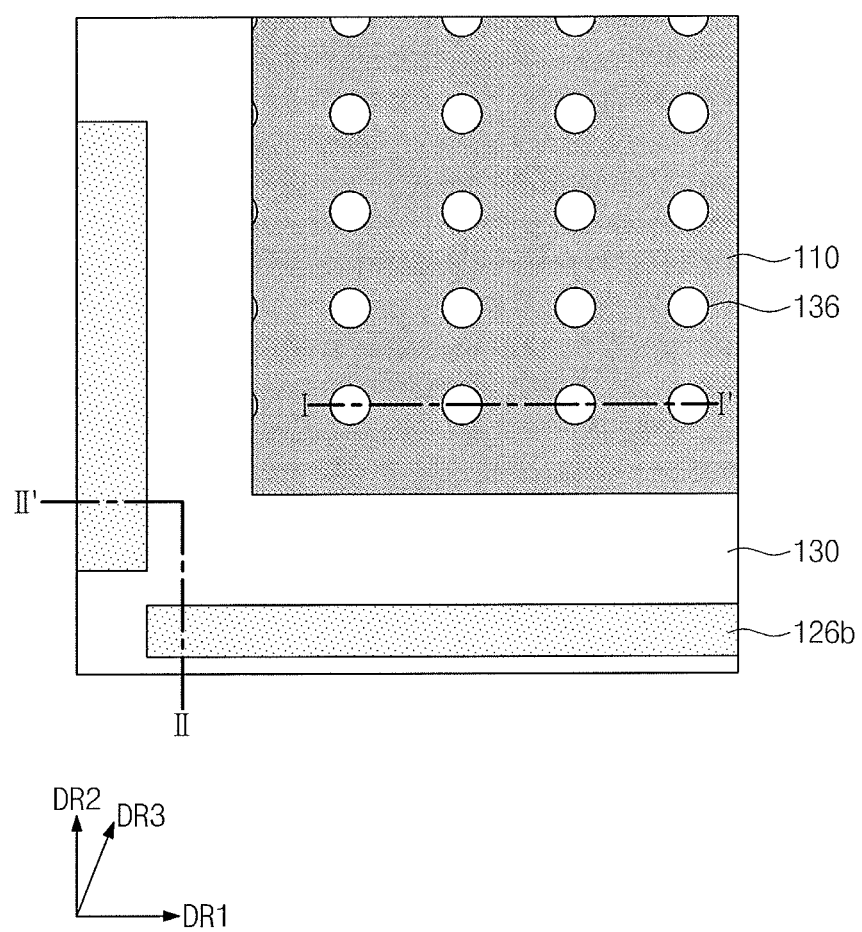
Figure 9B:
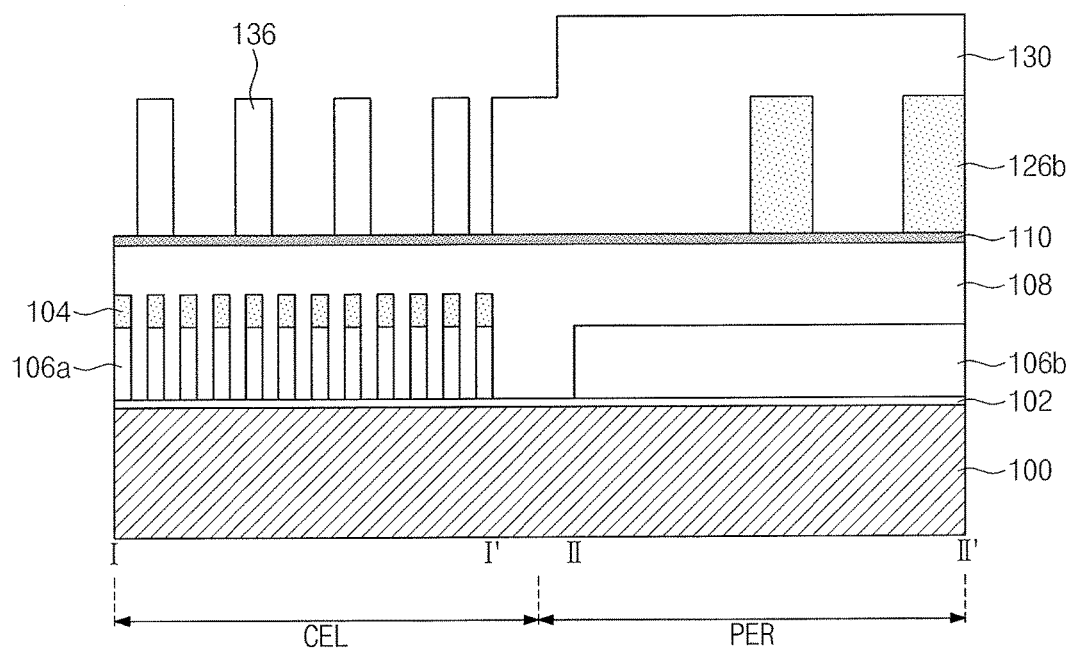

Referring to FIGS. 9A and 9B, the third cell pattern 126a of the cell region CEL may be removed. The removal process of the third cell pattern 126a may be performed, for example, using a wet etching process. At this time, the third peripheral pattern 126b may be covered by the fourth material layer 130. Thus, the third peripheral pattern 126b may not be removed during the removal process.

Outer sidewalls of the pillars 136 of the cell region CEL may be exposed by the removal process. The pillars 136 may be arranged in the substantially same form as the second holes 128.

In some embodiments, the remaining additional layer 132b of the peripheral region PER may be also removed by the removal process. Since the remaining additional layer 132b includes silicon oxide formed by the ALD process and the third cell pattern 126a includes silicon oxide, the remaining additional layer 132b may be also removed during the removal process of wet-etching the third cell pattern 126a.

According to some embodiments, the third cell pattern 126a may not be used as the mandrel pattern of the DPT process, but the pillars 136 filling the second holes 128 of the third cell pattern 126a may be used as the mandrel patterns of the DPT process. This may be defined as a reverse DPT process.

Figure 10A:
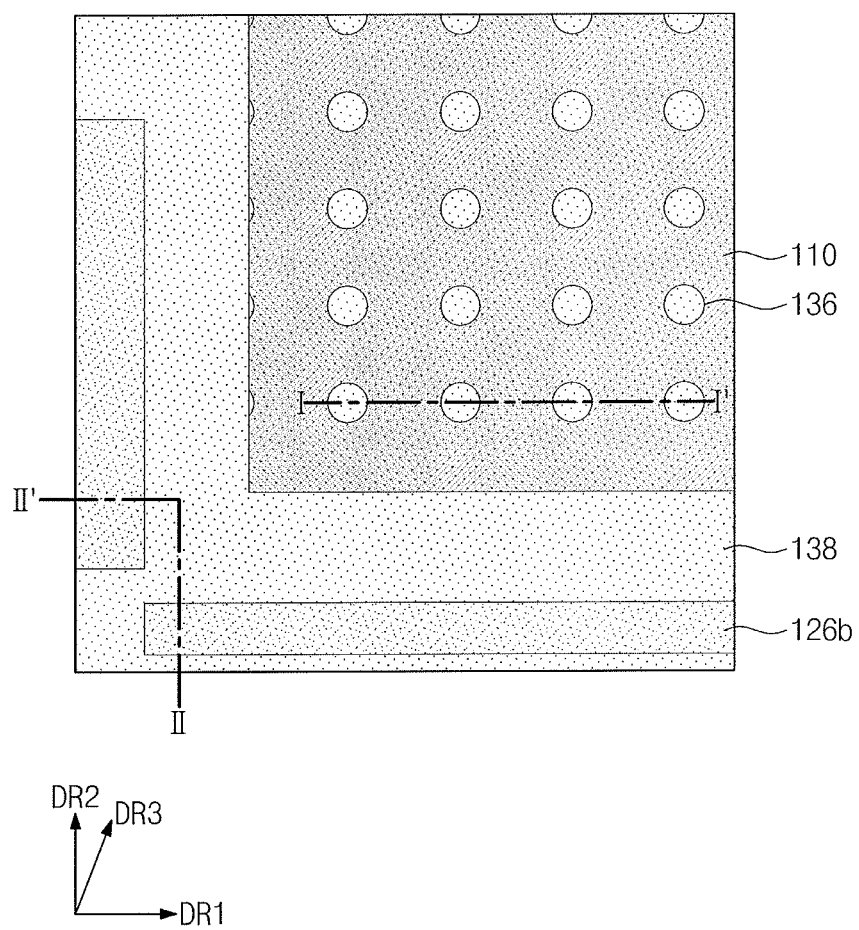
Figure 10B:
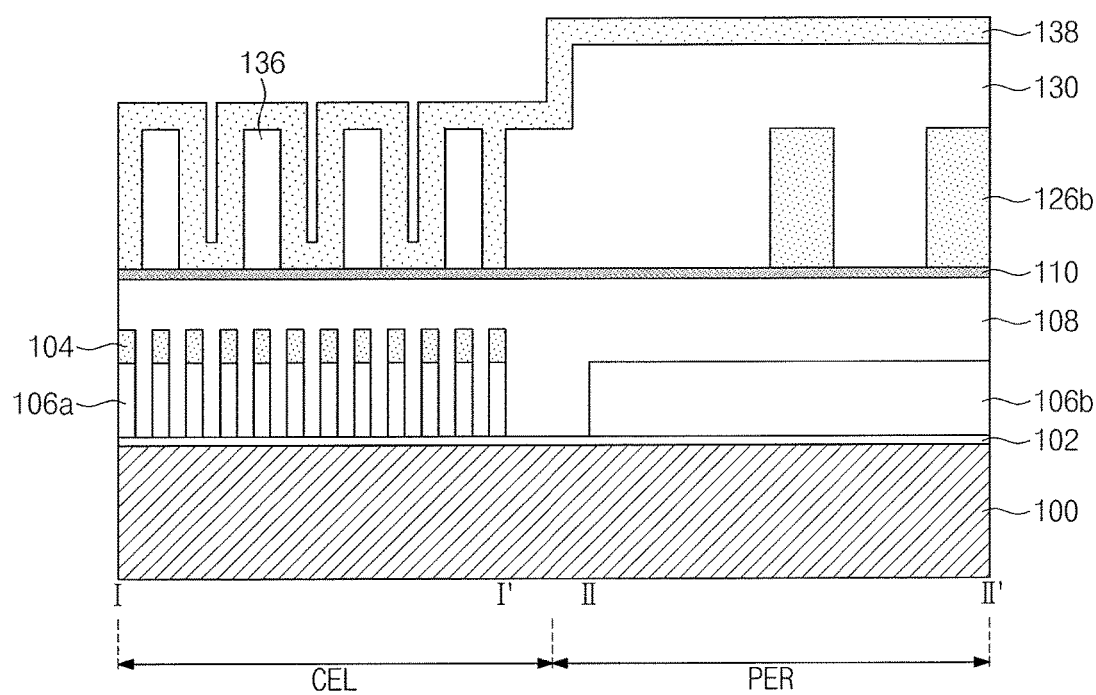

Referring to FIGS. 10A and 10B, a sixth material layer 138 may be conformally formed on the pillars 136 of the cell region CEL and the fourth material layer 130 of the peripheral region PER. The sixth material layer 138 may not completely fill a space between the pillars 136.

The sixth material layer 138 may include a material having an etch selectivity with respect to the pillars 136 and the fourth material layer 130. For example, the sixth material layer 138 may include silicon oxide formed by an ALD process.

Figure 11A:
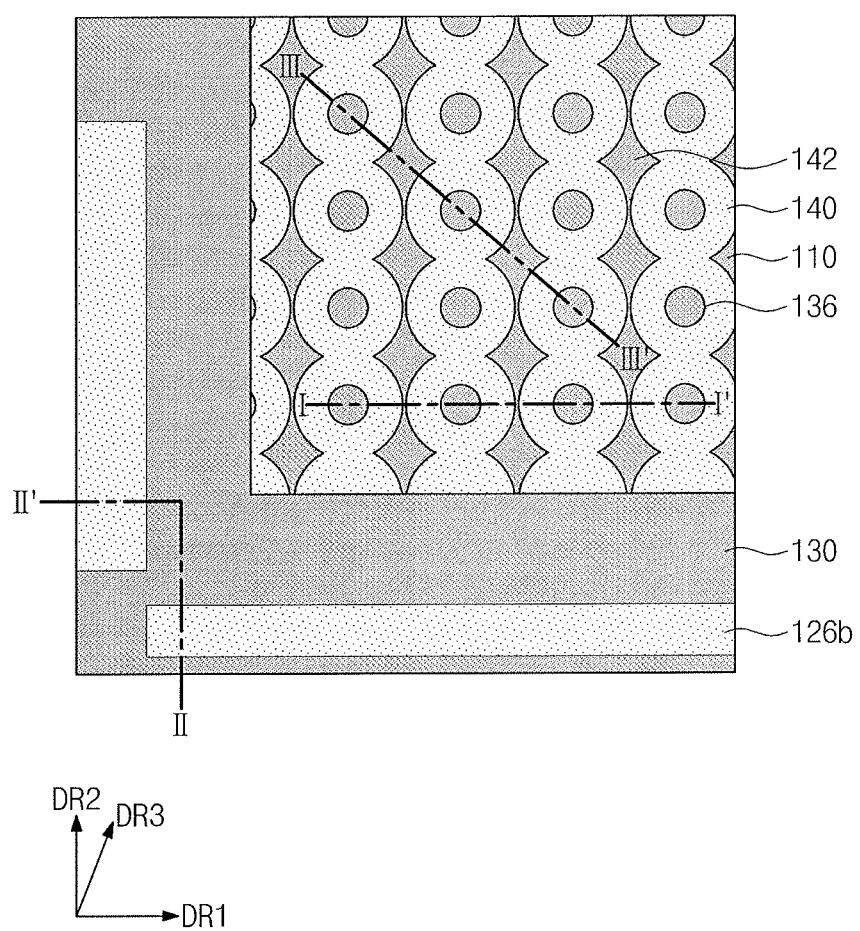
Figure 11B:
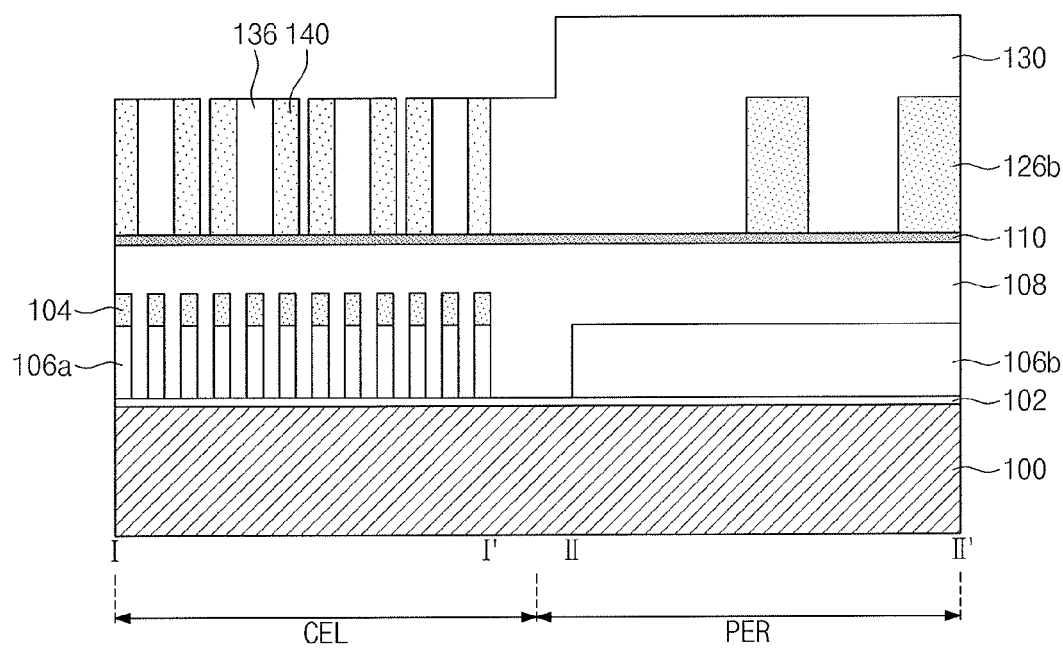
Figure 11C:
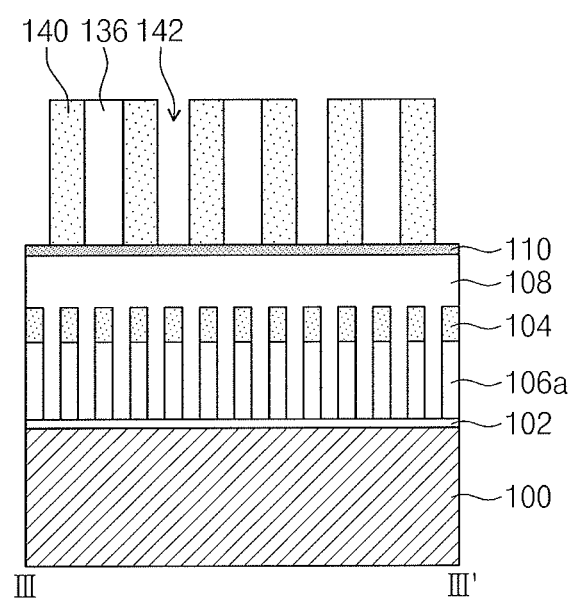

Referring to FIGS. 11A, 11B, and 11C, the sixth material layer 138 may be anisotropically etched to form first cell spacers 140 that surround the outer sidewalls of the pillars 136 in the cell region CEL, respectively. In some embodiments, the anisotropic etching process may include an etch-back process.

Each of the first cell spacers 140 may have a cylindrical shape surrounding the outer sidewall of each of the pillars 136. In some embodiments, the first cell spacers 140 adjacent to each other, for example, in the second direction DR2 may be in contact with each other, as illustrated in FIG. 11A. For example, at least portions of outer sidewalls of the adjacent first cell spacers 140 may be in contact with each other. At this time, the degree of contact of the outer sidewalls of the adjacent first cell spacers 140 may be adjusted depending on a thickness of the sixth material layer 138.

A third hole 142 may be defined by four first cell spacers 140 adjacent to each other when viewed from a plan view. For example, the third hole 142 having a substantially diamond shape may be defined by the four first cell spacers 140 arranged in 2×2 matrix form. The thickness of the sixth material layer 138 may be adjusted such that the third holes 142 adjacent to each other may be separated from or connected to each other. In one embodiment, a first peripheral spacer may be formed on a sidewall of the third peripheral pattern 126*b*.

Figure 12A:
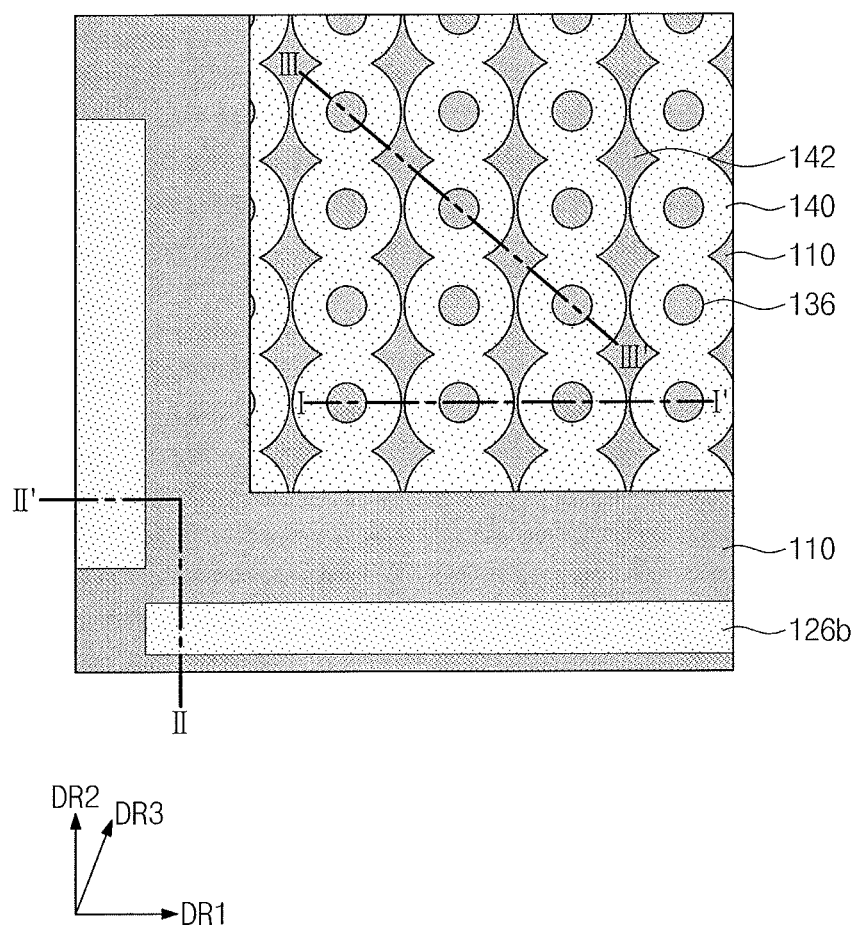
Figure 12B:
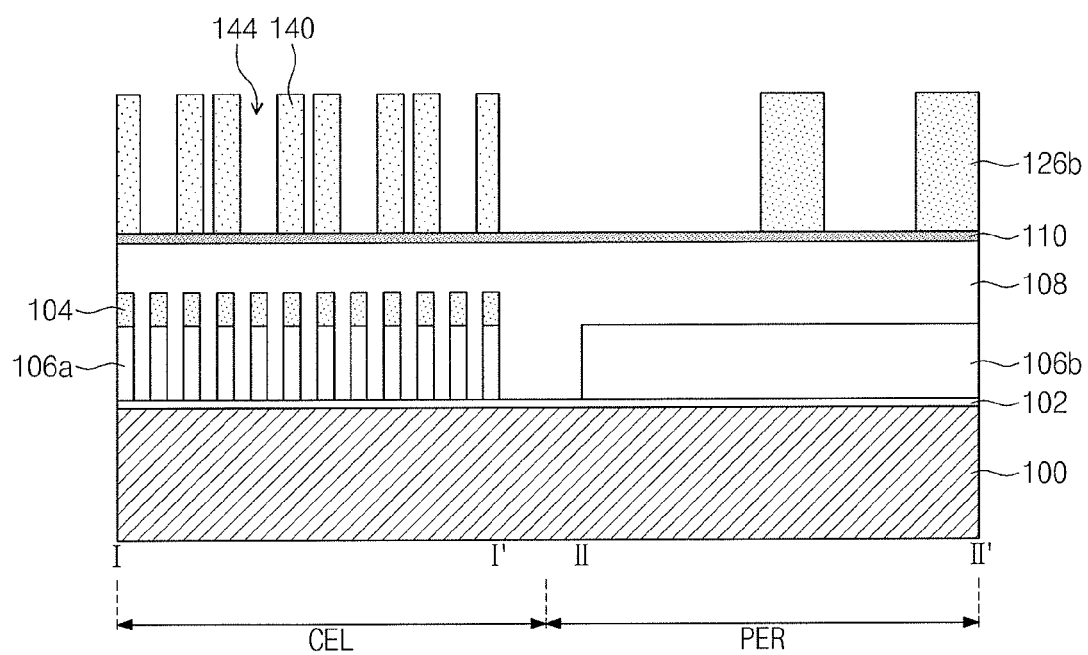
Figure 12C:
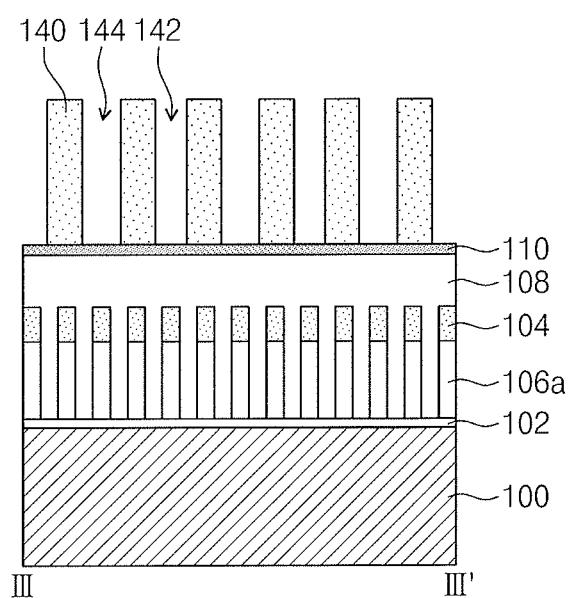

Referring to FIGS. 12A, 12B, and 12C, the pillars 136 of the cell region CEL and the fourth material layer 130 of the peripheral region PER may be removed. As described above, the pillars 136 may be formed from the fourth material layer 130 of the cell region CEL. The fourth material layer 130 may include, for example, the SOH material. The fourth material layer 130 may be removed, for example, by ashing and strip processes.

Fourth holes 144 may be formed by the process of removing the pillars 136 and the fourth material layer 130. Each of the fourth holes 144 may be defined by an inner sidewall of each of the first cell spacers 140. In some embodiments, the fourth holes 144 may be isolated from each other by the first cell spacers 140. The third holes 142 may be defined by the outer sidewalls of the first cell spacers 140 and may be isolated from or connected to each other depending on thicknesses of the first cell spacers 140.

Since the fourth material layer 130 of the peripheral region PER is removed, the third peripheral pattern 126*b* may be exposed. Top surfaces of the first cell spacers 140 may be disposed at the substantially same level as a top surface of the third peripheral pattern 126*b*. Heights of the first cell spacers 140 may be substantially equal to that of the third peripheral pattern 126*b*. In addition, the third peripheral pattern 126*b* and the first cell spacers 140 may include the same material (e.g., silicon oxide).

Figure 13A:
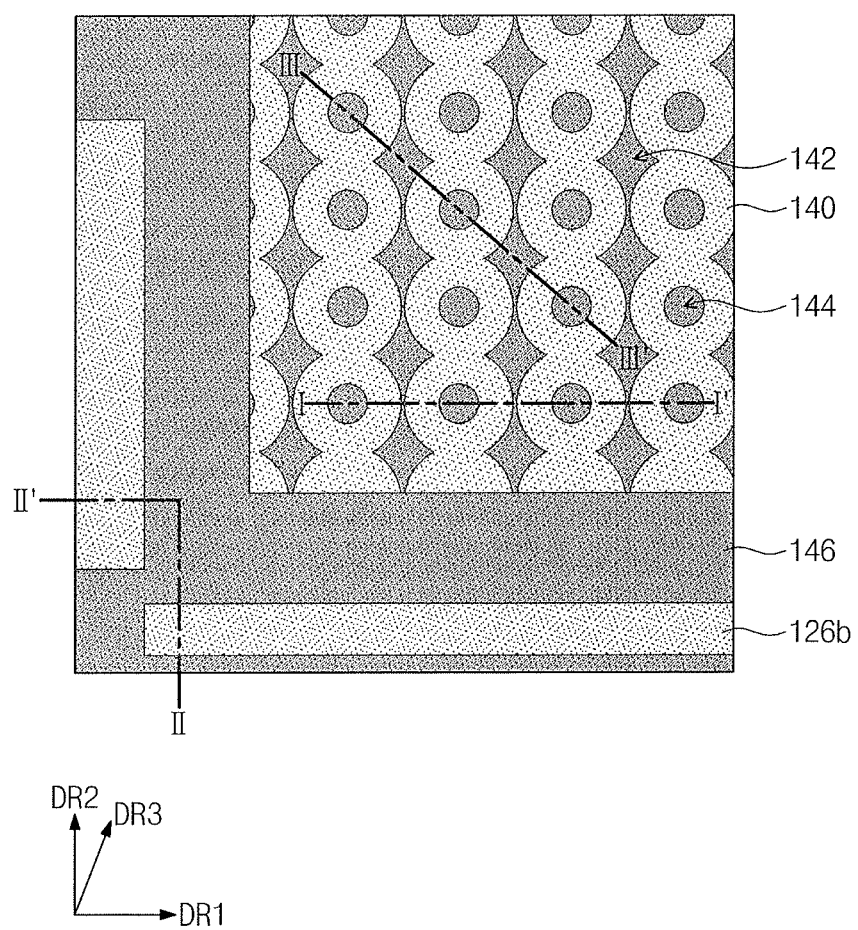
Figure 13B:
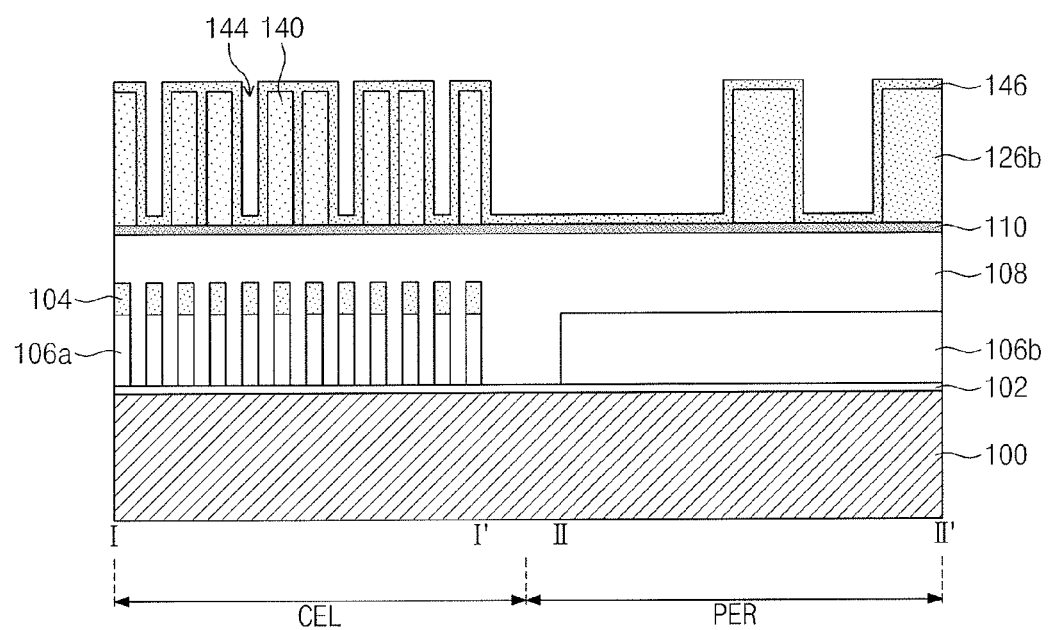
Figure 13C:
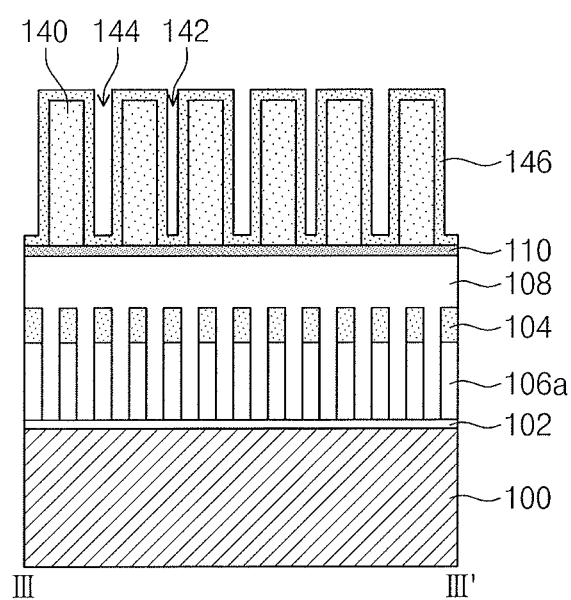

Referring to FIGS. 13A, 13B, and 13C, a seventh material layer 146 may be conformally formed on the first cell spacers 140, the first peripheral spacer, the third peripheral pattern 126*b*, and the second material layer 108. The seventh material layer 146 may not completely fill the third holes 142 and the fourth holes 144. For example, the seventh material layer 146 may include silicon oxide formed by an ALD process.

Figure 14A:
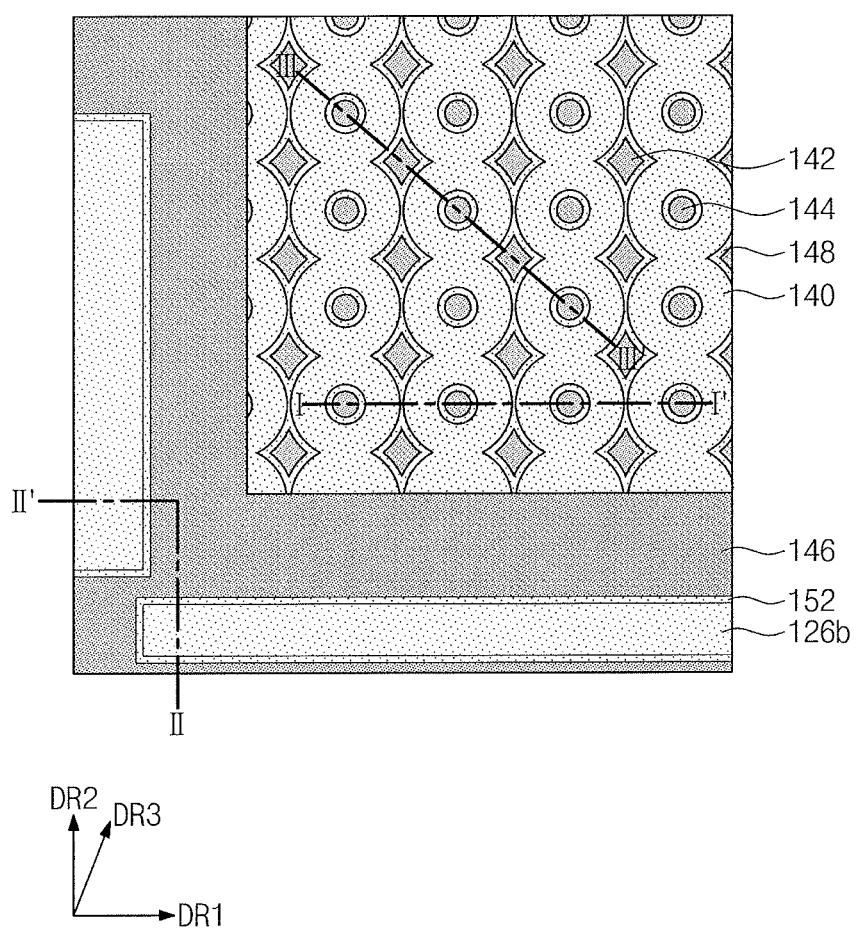
Figure 14B:
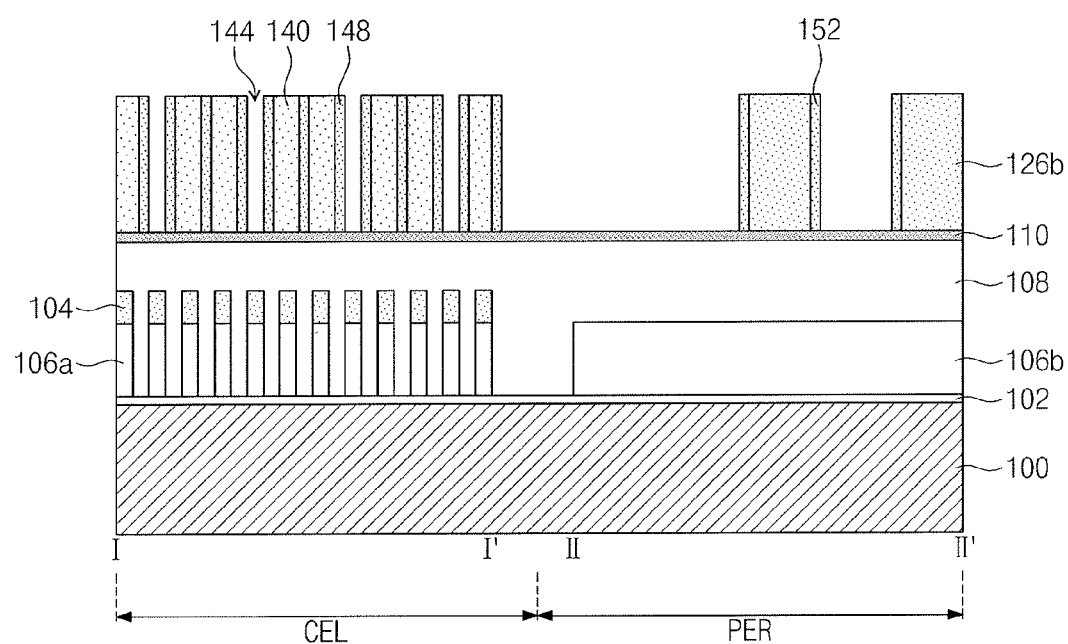
Figure 14C:
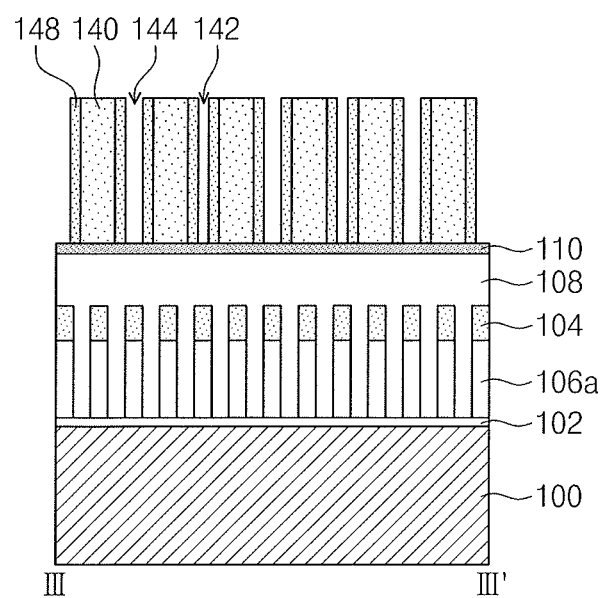

Referring to FIGS. 14A, 14B, and 14C, the seventh material layer 146 may be anisotropically etched to form second cell spacers 148 on the inner and outer sidewalls of the first cell spacers 140 and a second peripheral spacer 152 on the sidewall of the third peripheral pattern 126*b*.

As described above, portions of the third holes 142 may be connected to each other in some embodiments. In these cases, the second cell spacers 148 may be formed on the outer sidewalls of the first cell spacers 140. Thus, the third holes 142 may be separated from each other. In some embodiments, when the third holes 142 are separated or isolated from each other in FIGS. 12A, 12B, and 12C, the processes of FIGS. 13A to 13C and 14A to 14C may be omitted.

Figure 14D:
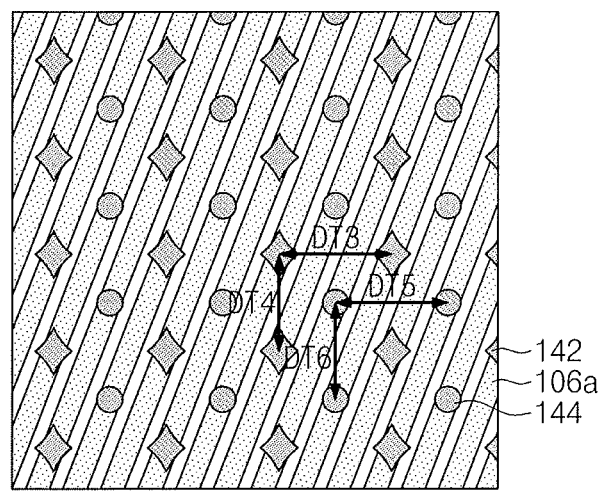
FIG. 14D illustrates an example of a relationship among first patterns and third and fourth holes in FIG. 14A.
Figure 14D:
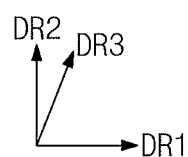

FIG. 14D illustrates an example of a relationship among the first cell patterns 106*a* and the third and fourth holes 142 and 144 of the cell region CEL. Referring to FIG. 14D, the third holes 142 may be spaced apart from each other and arranged along the first direction DR1 and the second direction DR2. The third holes 142 of a first row (or a first column) may be disposed at positions corresponding to the third holes 142 of a second row (or a second column).

The third holes 142 arranged in the first direction DR1 may be spaced apart from each other by a third distance DT3. The third holes 142 arranged in the second direction DR2 may be spaced apart from each other by a fourth distance DT4. The third distance DT3 may be different from the fourth distance DT4. In some embodiments, the third distance DT3 may be greater than the fourth distance DT4.

Two first cell patterns 106*a* may be between two third holes 142 adjacent to each other in the first direction DR1 when viewed from a plan view. Two third holes 142 adjacent to each other in the second direction DR2 may be respectively formed on two first cell patterns 106*a* adjacent to each other.

The fourth holes 144 may be spaced apart from each other and arranged along the first direction DR1 and the second direction DR2. The fourth holes 144 of a first row (or a first column) may be disposed at positions corresponding to the fourth holes 144 of a second row (or a second column).

The fourth holes 144 arranged in the first direction DR1 may be spaced apart from each other by a fifth distance DT5. The fourth holes 144 arranged in the second direction DR2 may be spaced apart from each other by a sixth distance DT6. The fifth distance DT5 may be different from the sixth distance DT6. For example, the fifth distance DT5 may be greater than the sixth distance DT6.

Two first cell patterns 106*a* may be between two fourth holes 144 adjacent to each other in the first direction DR1 when viewed from a plan view. Two fourth holes 144 adjacent to each other in the second direction DR2 may be respectively formed on two first cell patterns 106*a* adjacent to each other.

Each of the third and fourth holes 142 and 144 may be formed on one of the first cell patterns 106*a*. The third and fourth holes 142 and 144 may be alternately disposed on each of the first cell patterns 106*a* along a longitudinal direction of each of the first cell patterns 106*a*.

The rows (or columns) including the third holes 142 may correspond to odd-numbered rows (or odd-numbered columns), the rows (or columns) including the fourth holes 144 may correspond to even-numbered rows (or even-numbered columns). In other word, the rows (or columns) including the third holes 142 and the rows (or columns) including the fourth holes 144 may be alternately arranged along the second direction DR2 (or the first direction DR1).

Four fourth holes 144 adjacent to each other may surround one third hole 142 when viewed from a plan view. For example, the one third hole 142 may be at a center of a first imaginary quadrangle and the four fourth holes 144 may be at vertexes of the first imaginary quadrangle, respectively. Similarly, four third holes 142 adjacent to each other may surround one fourth hole 144 when viewed from a plan view. For example, the one fourth hole 144 may be at a center of a second imaginary quadrangle and the fourth third holes 142 may be at vertexes of the second imaginary quadrangle, respectively.

Figure 15A:
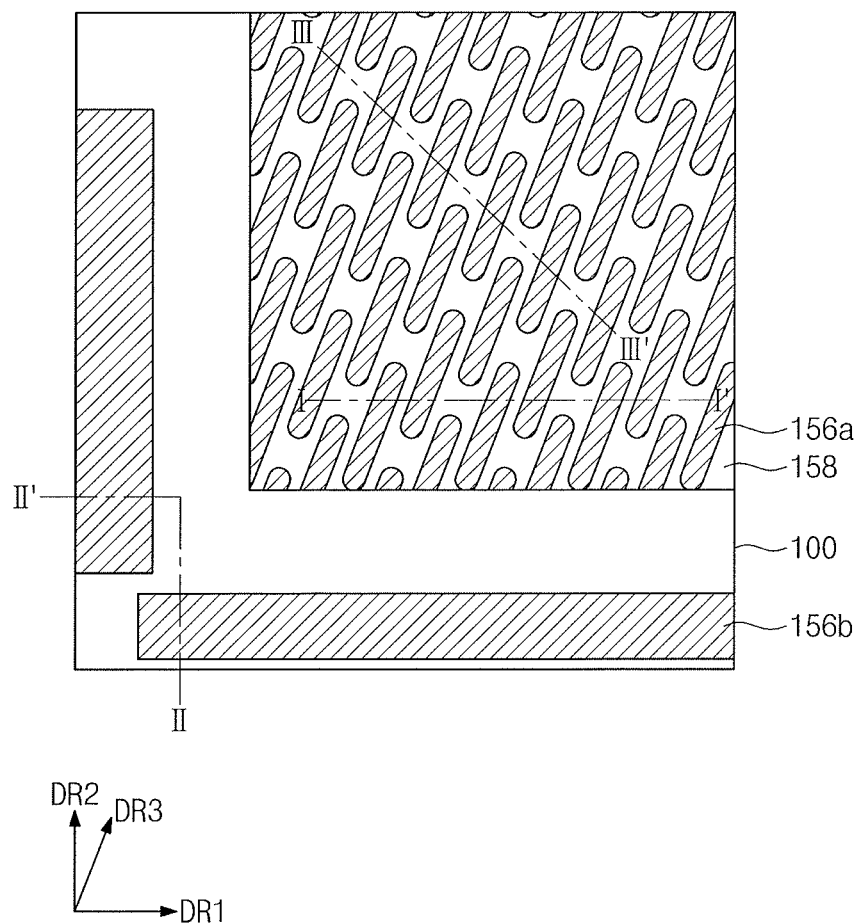
Figure 15B:
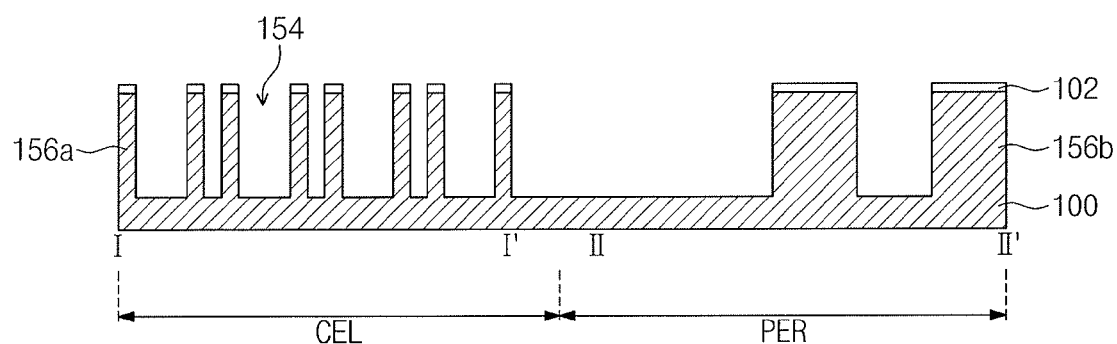
Figure 15C:
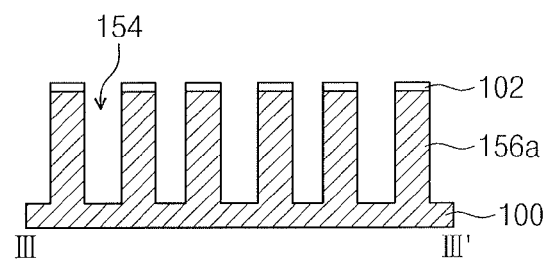

Referring to FIGS. 15A, 15B, and 15C, the buffer layer 110, the second material layer 108, the first mask patterns 104, the first patterns 106*a* and 106*b*, the pad oxide layer 102, and the substrate 100 may be sequentially etched using the first and second cell spacers 140 and 148, the third peripheral pattern 126*b* and the first and second peripheral spacers 152 as etch masks to form a trench 154 defining active regions 156*a* and 156*b* in the substrate 100. The active regions 156*a* and 156*b* may include cell active regions 156*a* in the cell region CEL and peripheral active regions 156*b* in the peripheral region PER.

The trench 154 may be a region formed by etching portions of the substrate 100 which correspond to spaces between the first patterns 106*a* and 106*b* and the third and fourth holes 142 and 144. Examples of planar shapes of the third and fourth holes 142 include a circular shape, an elliptical shape, and/or a diamond shape. The buffer layer 110, the second material layer 108 and the first mask patterns 104 may be sequentially etched through the third and fourth holes 142 and 144. Then, the pad oxide layer 102 and the substrate 100 may be sequentially etched using the first cell patterns 106a as additional etch masks.

As the etching process passes, shapes of regions etched through the third and fourth holes 142 and 144 may become close to rounded shapes. For example, when the etching process is an anisotropic plasma etching process, ion flux, radical flux, and by-product flux at an acute angle portion of the hole may be less than those at an obtuse angle portion of the hole. Thus, an etch rate of the acute angle portion may be reduced but an etch rate of the obtuse angle portion may be increased. As the etching process passes, this phenomenon may be repeated to complete the cell active regions 156a having rounded ends, for example, as illustrated in FIG. 15A.

Figure 16A:
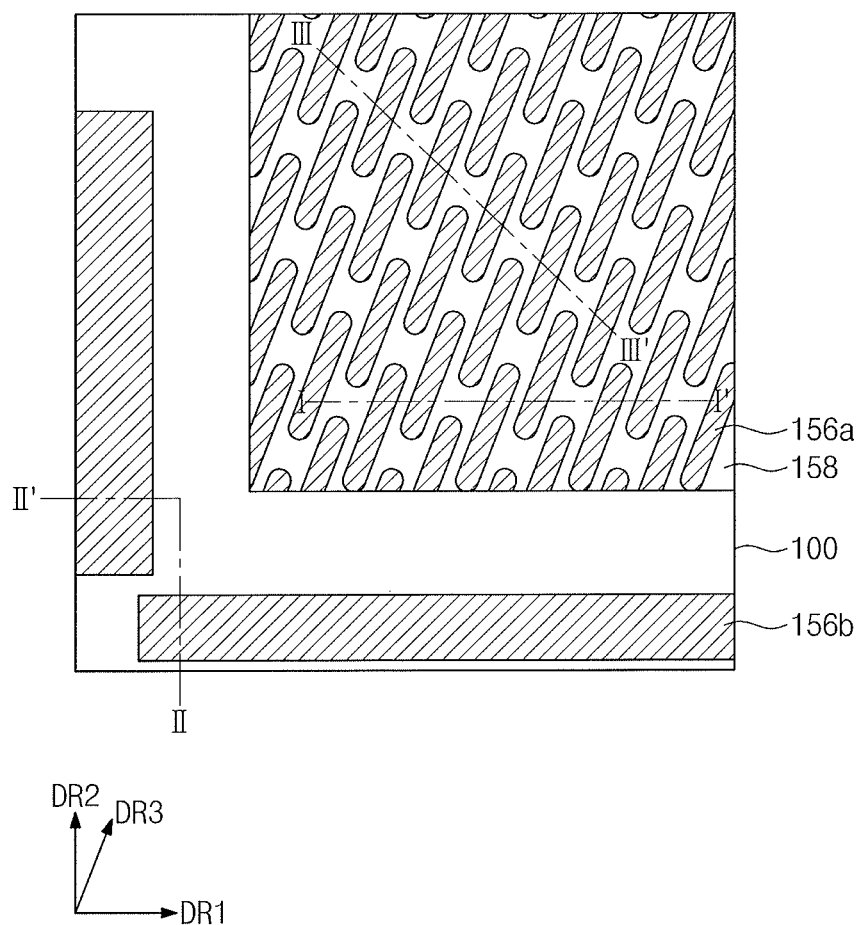
Figure 16B:
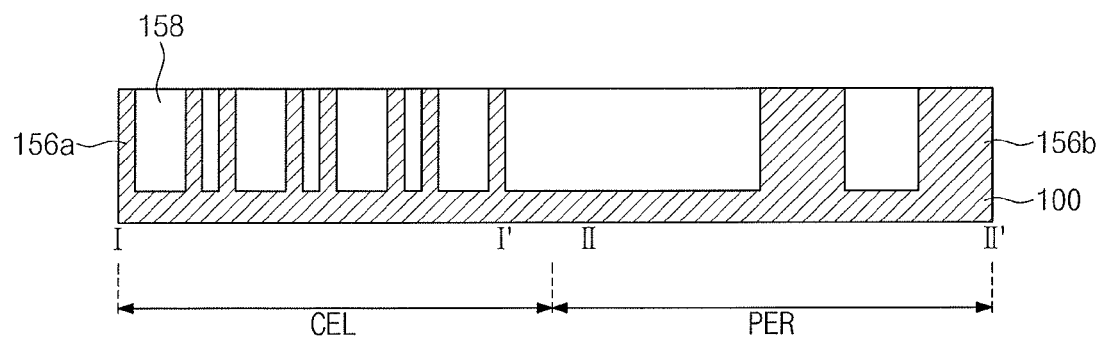
Figure 16C:
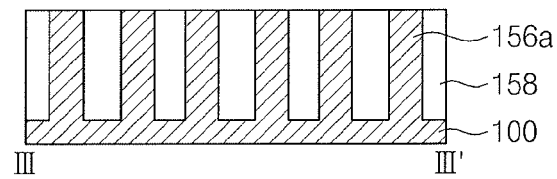

Referring to FIGS. 16A, 16B, and 16C, a device isolation layer 158 may be formed by filling the trench 154 with an insulating material. The insulating material may include, for example, at least one of silicon oxide, silicon nitride, or silicon oxynitride. The pad oxide layer 102 may be removed after formation of device isolation layer 158.

Figure 17A:
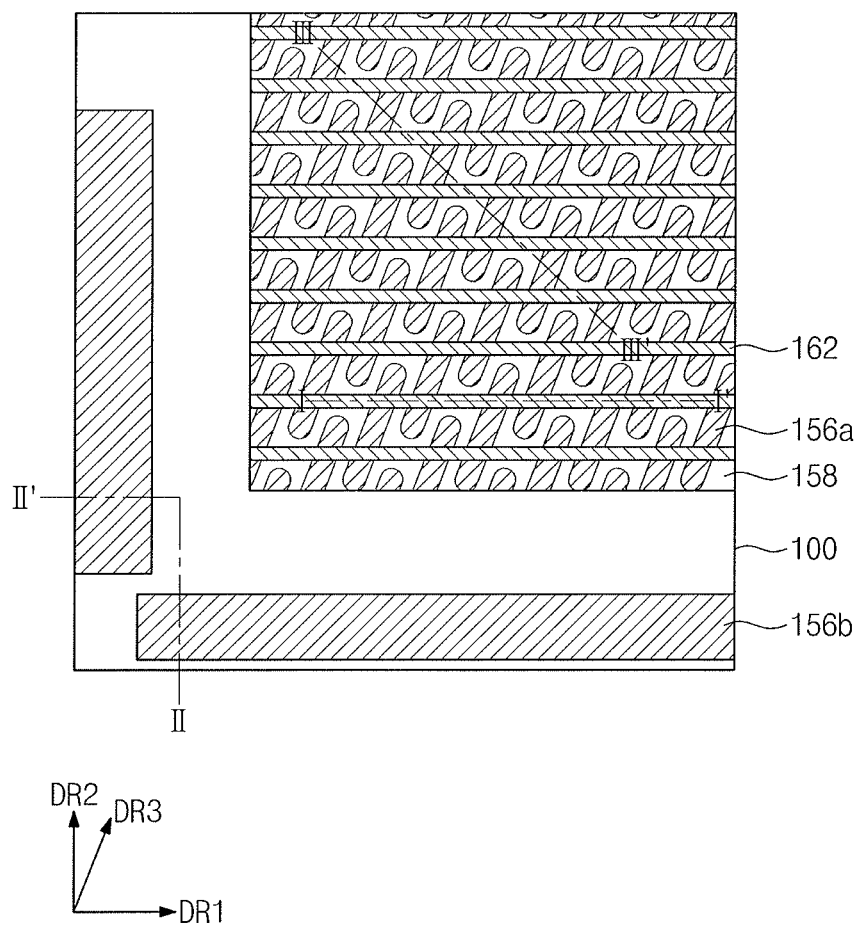
Figure 17B:
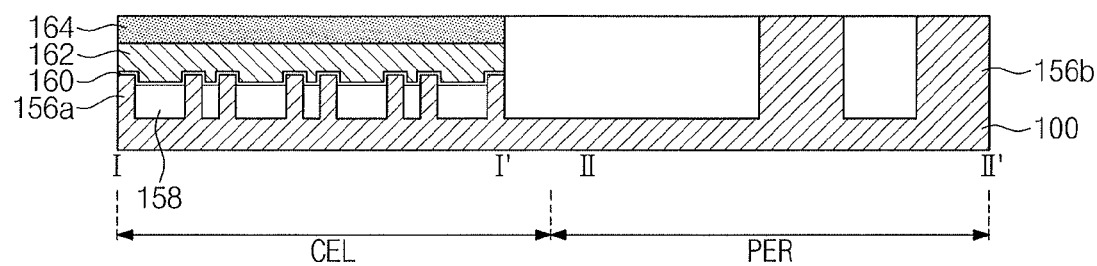
Figure 17C:
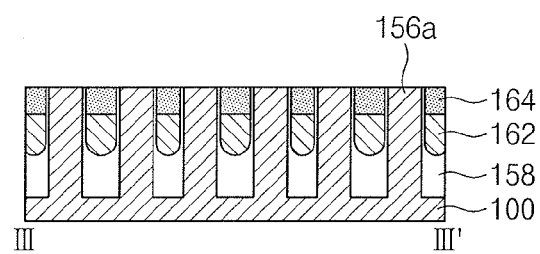

Referring to FIGS. 17A, 17B, and 17C, gate electrodes 162 extending in the first direction DR1 may be formed on the substrate 100 having the device isolation layer 158. For example, recess regions may be formed the device isolation layer 158 and the cell active regions 156a. The recess regions may extend in the first direction DR1 to intersect the device isolation layer 158 and the cell active regions 156a. The recess regions may be parallel to each other and may be arranged at equal distances.

A gate insulating layer 160 may be formed on inner surfaces of the recess regions. The gate insulating layer 160 may include, for example, at least one of silicon oxide or a metal oxide (e.g., hafnium oxide, aluminum oxide, or zirconium oxide).

Subsequently, the gate electrodes 162 may be formed on the gate insulating layer 160 by filling lower portions of the recess regions with a conductive material. The conductive material may include, for example, at least one of poly-silicon doped with dopants or a metal (e.g., tungsten).

Capping patterns 164 may be formed on the gate electrodes 162 in the recess regions, respectively. The capping patterns 164 may protect the gate electrodes 162 and may include at least one of silicon nitride or silicon oxynitride.

Dopants may be injected into the cell active regions 156a to form source/drain regions. Thus, transistors may be formed. In the present embodiment, a buried channel array transistor (BCAT) is described as an example. In another embodiment, the transistor may be different from a BCAT.

Next, bit lines and capacitors electrically connected to the source/drain regions may be formed to manufacture memory cells of a dynamic random access memory (DRAM) device.

According to one or more embodiments, the reverse DPT process may be performed on the cell region after blocking the peripheral region. Thus, the fabrication processes of the semiconductor device may be efficiently performed. In addition, the reverse DPT process may be performed to form the trench defining the active regions, so a plurality of photolithography processes may be omitted.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A method of fabricating a semiconductor device, the method comprising:
   preparing a substrate including a cell region and a peripheral region;
   forming first cell patterns in an extending direction and parallel to each other on the substrate of the cell region;
   forming a first material layer filling a space between the first cell patterns on the substrate of the cell and peripheral regions;
   forming a second cell pattern including first holes on the first material layer of the cell region and a peripheral pattern on the first material layer of the peripheral region;
   forming a predetermined material respectively filling the first holes of the second cell pattern;
   forming a blocking layer on the peripheral pattern and selectively covering the peripheral region;
   etching a portion of the predetermined material using the blocking layer as an etch mask to expose the second cell pattern and to form pillars between respective ones of the first holes;
   forming cell spacers on outer sidewalls of the pillars to define second holes, each of the second holes corresponding to four cell spacers adjacent to each other;
   removing the pillars to form third holes corresponding to the cell spacers, respectively; and
   etching the substrate using the cell spacers, the first cell patterns, and the peripheral pattern as etch masks to form a trench, wherein forming the second cell pattern, the peripheral pattern, the pillars, and the blocking layer includes:
      forming a second material layer on the first material layer;
      forming a cell mask pattern on the second material layer of the cell region and a peripheral mask pattern on the second material layer of the peripheral region, the cell mask pattern having holes corresponding to the first holes;
      etching the second material layer using the cell mask pattern and the peripheral mask pattern as etch masks to form the second cell pattern and the peripheral pattern;
      forming a third material layer filling the first holes of the second cell pattern on the second cell pattern and the peripheral pattern, the third material layer including the predetermined material;
      forming the blocking layer on the third material layer of the peripheral region; and
      performing an etch-back process on the third material layer of the cell region exposed by the blocking layer until a top surface of the second cell pattern is exposed to form the pillars.

2. The method as claimed in claim 1, wherein the first cell patterns include a material having an etch selectivity with respect to the first material layer and the cell spacers.

3. The method as claimed in claim 2, wherein:
   the first cell patterns include poly-silicon, the first material layer includes a spin-on-hardmask (SOH) material, and the cell spacers include silicon oxide.

4. The method as claimed in claim 1, wherein the blocking layer is etched during the etch-back process performed on the third material layer of the cell region.

5. The method as claimed in claim 4, wherein the third material layer includes a material having an etch selectivity with respect to the second material layer.

6. The method as claimed in claim 5, wherein:

the second material layer includes silicon oxide, and the third material layer includes a spin-on-hardmask (SOH) material.

7. The method as claimed in claim 5, wherein the blocking layer includes a photoresist material.

8. The method as claimed in claim 1, further comprising:

conformally forming a spacer layer on the first material layer on which the cell spacers are formed, wherein the spacer layer partially fills the second and third holes.

9. The method as claimed in claim 8, further comprising:

anisotropically etching the spacer layer to form additional cell spacers on inner sidewalls and outer sidewalls of the cell spacers, wherein etching the substrate includes etching the substrate of the cell region using the additional cell spacers, the cell spacers, and the first cell patterns as etch masks to form the trench.

10. The method as claimed in claim 1, further comprising:

forming a device isolation layer defining active regions by filling the trench with an insulating material, wherein each of the active regions has an elliptical shape having a long axis parallel to the extending direction of the first cell pattern.

11. The method as claimed in claim 1, wherein:

each of the second holes is formed on one of the first cell patterns, the second holes are spaced apart from each other and arranged along a first direction and a second direction crossing the first direction, each of the first cell patterns extends in a direction perpendicular to the first and second directions, two first cell patterns are formed between two second holes adjacent to each other in the first direction, and two second holes adjacent to each other in the second direction are respectively formed on two first cell patterns adjacent to each other.

12. The method as claimed in claim 1, wherein:

each of the third holes is formed on one of the first cell patterns, the third holes are spaced apart from each other and arranged along a first direction and a second direction perpendicular to the first direction, each of the first cell patterns extends in a direction not perpendicular to the first and second directions, two first cell patterns are between two third holes adjacent to each other in the first direction, and two third holes adjacent to each other in the second direction are respectively formed on two first cell patterns adjacent to each other.

13. The method as claimed in claim 1, wherein:

the second holes and the third holes are alternately arranged on each of the first cell patterns along a longitudinal direction of each of the first cell patterns, adjacent four of the third holes surround one of the second holes, the one of the second holes is at a center of a first imaginary quadrangle and the adjacent four of the third holes are at vertexes of the first imaginary quadrangle, respectively, adjacent four of the second holes surround one of the third holes, and the one of the third holes is at a center of a second imaginary quadrangle and the adjacent four of the second holes are at vertexes of the second imaginary quadrangle, respectively.

14. The method as claimed in claim 1, wherein:

each of the second holes has a diamond shape, and each of the third holes has a circular shape or an elliptical shape.

15. A method of fabricating a semiconductor device, the method comprising:

preparing a substrate including a cell region and a peripheral region;

forming first cell patterns in an extending direction and parallel to each other on the substrate of the cell region;

forming a first material layer filling a space between the first cell patterns on the substrate of the cell and peripheral regions;

forming a second cell pattern including first holes on the first material layer of the cell region and a peripheral pattern on the first material layer of the peripheral region;

forming a predetermined material respectively filling the first holes of the second cell pattern;

forming a blocking layer on the peripheral pattern and selectively covering the peripheral region;

etching a portion of the predetermined material using the blocking layer as an etch mask to expose the second cell pattern and to form pillars between respective ones of the first holes;

forming cell spacers on outer sidewalls of the pillars to define second holes, each of the second holes corresponding to four cell spacers adjacent to each other;

removing the pillars to form third holes corresponding to the cell spacers, respectively; and etching the substrate using the cell spacers, the first cell patterns, and the peripheral pattern as etch masks to form a trench, wherein:

the second holes and the third holes are alternately arranged on each of the first cell patterns along a longitudinal direction of each of the first cell patterns, adjacent four of the third holes surround one of the second holes, the one of the second holes is at a center of a first imaginary quadrangle and the adjacent four of the third holes are at vertexes of the first imaginary quadrangle, respectively, adjacent four of the second holes surround one of the third holes, and the one of the third holes is at a center of a second imaginary quadrangle and the adjacent four of the second holes are at vertexes of the second imaginary quadrangle, respectively.

* * * * *